(12) United States Patent (10) Patent No.: US 9,723,765 B2
DeMars (45) Date of Patent: Aug. 1, 2017

(54) PERIMETER VENTILATION SYSTEM FOR ELECTRONIC DISPLAY

(71) Applicant: Manufacturing Resources International, Inc., Alpharetta, GA (US)

(72) Inventor: Ryan DeMars, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 14/624,268

(22) Filed: Feb. 17, 2015

(65) Prior Publication Data

US 2016/0242329 A1  Aug. 18, 2016

(51) Int. Cl.
 *H05K 7/20* (2006.01)

(52) U.S. Cl.
 CPC ............................ *H05K 7/20972* (2013.01)

(58) Field of Classification Search
 CPC .................................................. H05K 7/20972
 USPC ........................................................ 361/692
 See application file for complete search history.

(56) References Cited

U.S. PATENT DOCUMENTS

| | | |
|---|---|---|
| 4,093,355 A | 6/1978 | Kaplit et al. |
| 4,593,978 A | 6/1986 | Mourey et al. |
| 4,634,225 A | 1/1987 | Haim et al. |
| 5,029,982 A | 7/1991 | Nash |
| 5,088,806 A | 2/1992 | McCartney et al. |
| 5,247,374 A | 9/1993 | Terada |
| 5,559,614 A | 9/1996 | Urbish et al. |
| 5,748,269 A | 5/1998 | Harris et al. |
| 5,767,489 A | 6/1998 | Ferrier |
| 5,818,010 A | 10/1998 | McCann |
| 5,869,919 A | 2/1999 | Sato |
| 5,991,153 A | 11/1999 | Heady |
| 6,089,751 A | 7/2000 | Conover et al. |
| 6,157,432 A | 12/2000 | Helbing |
| 6,191,839 B1 | 2/2001 | Briley |

(Continued)

FOREIGN PATENT DOCUMENTS

| | | |
|---|---|---|
| EP | 1647766 | 4/2006 |
| GB | 2402205 | 12/2004 |

(Continued)

OTHER PUBLICATIONS

Zeef, Hubing, EMC analysis of 18' LCD Monitor, Aug. 2000, 1 page.

*Primary Examiner* — Tuan T Dinh
*Assistant Examiner* — Mukund G Patel
(74) *Attorney, Agent, or Firm* — Standley Law Group LLP

(57) ABSTRACT

The exemplary embodiments herein provide an electronic display assembly having an electronic display surrounded by a front panel and a housing. An ingestion gap may be placed near a portion of the perimeter of the front panel while an exhaustion gap may be placed near an opposing portion of the perimeter of the front panel. A buffer zone may be defined between the ingestion gap and the exhaustion gap. A fan may be positioned to draw open loop fluid into the ingestion gap, through a channel behind the electronic display, and out of the exhaustion gap. This fan may also draw open loop fluid through an optional heat exchanger. A circulating fan may force circulating air through an optional heat exchanger.

14 Claims, 28 Drawing Sheets

(56) References Cited

U.S. PATENT DOCUMENTS

| | | |
|---|---|---|
| 6,392,727 B1 | 5/2002 | Larson |
| 6,417,900 B1 | 7/2002 | Shin et al. |
| 6,428,198 B1 | 8/2002 | Saccomanno |
| 6,437,673 B1 | 8/2002 | Nishida |
| 6,473,150 B1 | 10/2002 | Takushima |
| 6,493,440 B2 | 12/2002 | Gromatzky |
| 6,535,266 B1 | 3/2003 | Nemeth et al. |
| 6,628,355 B1 | 9/2003 | Takahara |
| 6,683,639 B2 | 1/2004 | Scheper |
| 6,839,104 B2 | 1/2005 | Taniguchi et al. |
| 6,885,412 B2 | 4/2005 | Ohnishi et al. |
| 6,909,486 B2 | 6/2005 | Wang |
| 6,943,768 B2 | 9/2005 | Cavanaugh et al. |
| 6,961,108 B2 | 11/2005 | Wang |
| 7,059,757 B2 | 6/2006 | Shimizu |
| 7,083,285 B2 | 8/2006 | Hsu |
| 7,284,874 B2 | 10/2007 | Jeong et al. |
| 7,813,124 B2 | 10/2010 | Karppanen |
| 8,035,968 B2 | 10/2011 | Kwon |
| 8,248,784 B2 * | 8/2012 | Nakamichi ........ H05K 7/20972 361/679.46 |
| 8,369,083 B2 | 2/2013 | Dunn |
| 2001/0001459 A1 | 5/2001 | Savant |
| 2001/0019454 A1 | 9/2001 | Tadic-Galeb |
| 2002/0033919 A1 | 3/2002 | Sanelle |
| 2002/0101553 A1 | 8/2002 | Enomoto et al. |
| 2002/0126248 A1 | 9/2002 | Yoshida |
| 2003/0007109 A1 | 1/2003 | Park |
| 2003/0104210 A1 | 6/2003 | Azumi |
| 2004/0036834 A1 | 2/2004 | Ohnishi et al. |
| 2004/0105159 A1 | 6/2004 | Saccomanno |
| 2004/0165139 A1 | 8/2004 | Anderson et al. |
| 2005/0012722 A1 | 1/2005 | Chon |
| 2005/0073632 A1 | 4/2005 | Dunn |
| 2005/0213950 A1 | 9/2005 | Yoshimura |
| 2006/0012958 A1 | 1/2006 | Tomioka |
| 2006/0012985 A1 | 1/2006 | Archie, Jr. |
| 2006/0082271 A1 | 4/2006 | Lee |
| 2006/0092348 A1 | 5/2006 | Park |
| 2006/0132699 A1 | 6/2006 | Cho |
| 2006/0177587 A1 | 8/2006 | Ishizuka |
| 2006/0199514 A1 | 9/2006 | Kimura |
| 2006/0209266 A1 | 9/2006 | Utsunomiya |
| 2006/0283579 A1 | 12/2006 | Ghosh |
| 2007/0019419 A1 | 1/2007 | Hafuka |
| 2007/0103866 A1 | 5/2007 | Park |
| 2007/0140671 A1 | 6/2007 | Yoshimura |
| 2007/0151664 A1 | 7/2007 | Shin |
| 2007/0171353 A1 | 7/2007 | Hong |
| 2007/0206158 A1 | 9/2007 | Kinoshita |
| 2007/0212211 A1 | 9/2007 | Chiyoda |
| 2007/0267174 A1 | 11/2007 | Kim |
| 2008/0209934 A1 | 9/2008 | Richards |
| 2009/0126906 A1 | 5/2009 | Dunn |
| 2009/0154096 A1 | 6/2009 | Iyengar |
| 2009/0231807 A1 * | 9/2009 | Bouissiere ........ H05K 7/20972 361/690 |
| 2010/0079949 A1 | 4/2010 | Nakamichi |
| 2011/0013114 A1 | 1/2011 | Dunn |
| 2011/0058326 A1 | 3/2011 | Idems |
| 2011/0090630 A1 | 4/2011 | Bergeron |
| 2012/0020114 A1 | 1/2012 | Miyamoto |
| 2012/0038849 A1 | 2/2012 | Dunn |
| 2012/0044217 A1 | 2/2012 | Okada |
| 2012/0106081 A1 | 5/2012 | Hubbard |
| 2012/0255704 A1 | 10/2012 | Nakamichi |
| 2012/0274876 A1 | 11/2012 | Cappaert |
| 2013/0201685 A1 * | 8/2013 | Messmore ........ H05K 7/20972 362/249.01 |
| 2014/0111758 A1 | 4/2014 | Dunn |

FOREIGN PATENT DOCUMENTS

| | | |
|---|---|---|
| JP | 03153212 | 7/1991 |
| JP | 08194437 | 7/1996 |
| JP | 11160727 | 6/1999 |
| JP | 11296094 | 10/1999 |
| JP | 2002158475 | 5/2002 |
| JP | 2005134849 | 5/2005 |
| JP | 09307257 | 11/2007 |
| JP | 2008292743 | 12/2008 |
| JP | 2010024624 | 2/2010 |
| KR | 20050033986 | 4/2005 |
| KR | 20060016469 | 2/2006 |
| KR | 100666961 | 1/2007 |
| KR | 1020070070675 | 7/2007 |
| WO | WO2005079129 | 8/2005 |

* cited by examiner

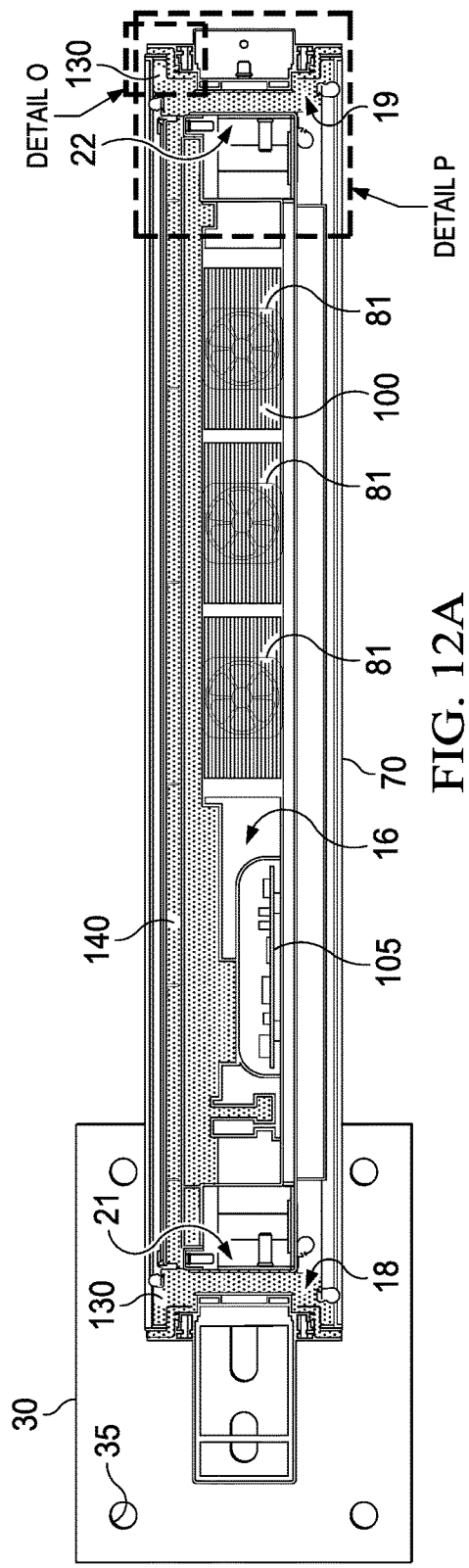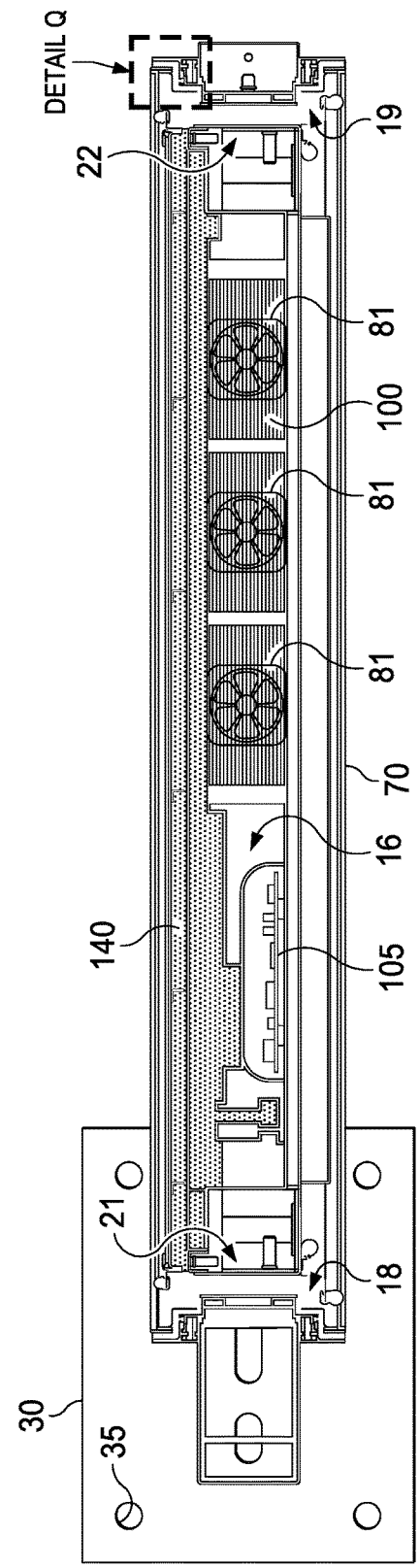
FIG. 12A
FIG. 12B

PERIMETER VENTILATION SYSTEM FOR ELECTRONIC DISPLAY

CROSS-REFERENCE TO RELATED APPLICATIONS

This application is a non-provisional application and does not claim priority to any co-pending applications.

TECHNICAL FIELD

Embodiments of the present invention generally relate to mounting and cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise a display assembly and a free standing display housing. The display assembly may be mounted within the free standing display housing. The display assembly may comprise an ingestion gap that is positioned along the perimeter of a front panel, as well as an exhaustion gap that is positioned along an opposing portion of the perimeter of the front panel. A fan may be positioned to force open loop fluid into the ingestion gap, through a channel behind the electronic display, and out of the exhaustion gap.

The same fan or an additional fan may be used to force open loop fluid through an optional heat exchanger as well. An additional circulating fan may be used to circulate a closed loop fluid through the heat exchanger as well.

A buffer zone may be placed between the ingestion gap and the exhaustion gap and preferably contains one or more septums which substantially limit or prohibit the vertical flow of open loop fluid once ingested into the housing. The septums are generally positioned horizontally and near the vertical center of the display assembly (although not required).

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 12A is a top plan section view taken along section line F-F of FIG. 11, and indicating Detail O and Detail P.

FIG. 12B is a top plan section view taken along section line G-G of FIG. 11, and indicating Detail Q.

DETAILED DESCRIPTION OF EXEMPLARY EMBODIMENT(S)

Figure 1:
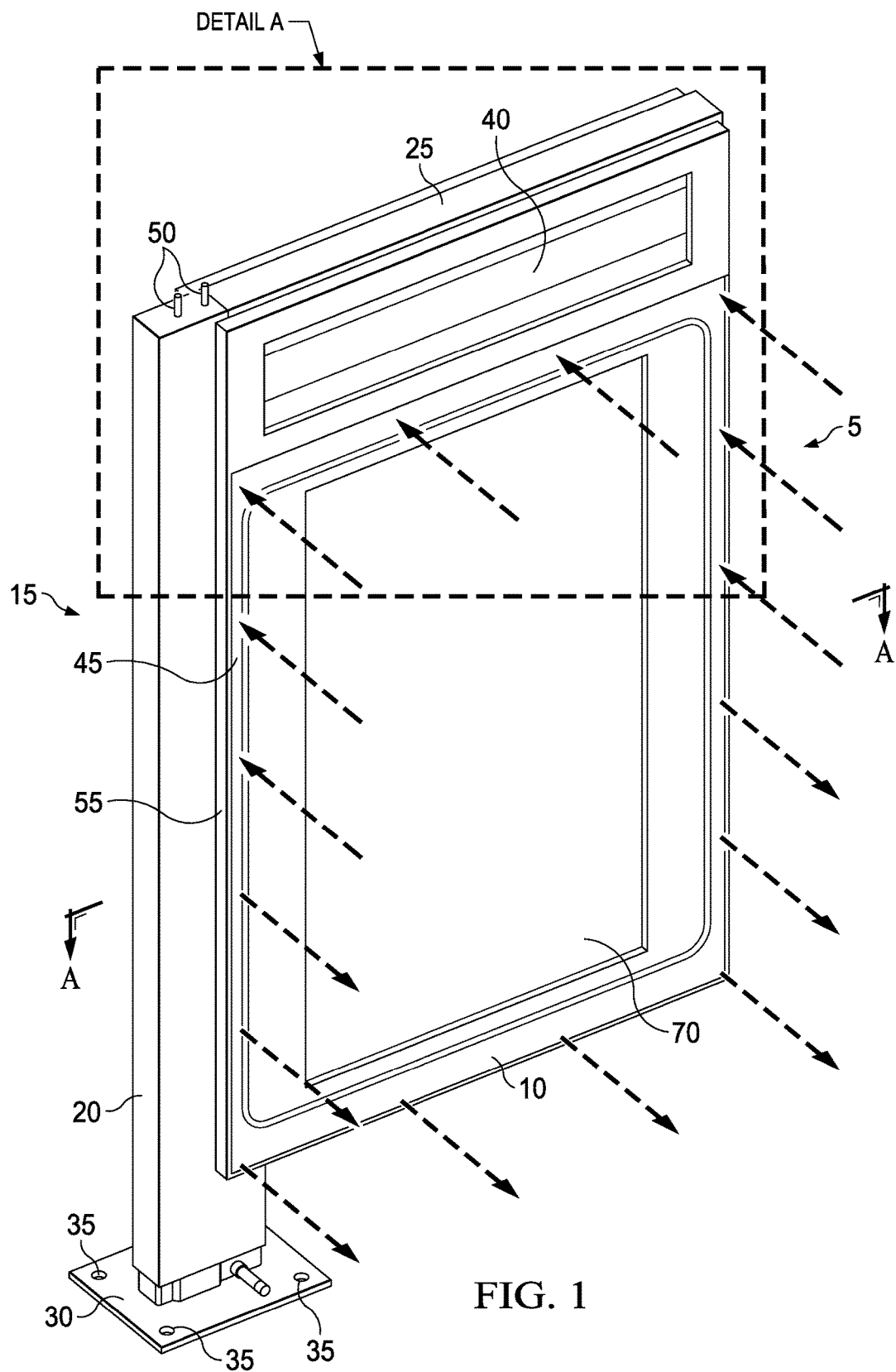
FIG. 1 is a front perspective view of an exemplary embodiment of the electronic display assembly housed in a free standing housing, and indicating section line A-A and Detail A.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exemplary embodiment of an electronic display assembly 5 (hereinafter also the "assembly"). The electronic display assembly 5 comprises a front panel 10 that may cover the majority of the front surface of the assembly 5. The front panel 10 may be transparent and positioned in front of an electronic display 70, which is preferably secured behind the front panel 10. In exemplary embodiments, the front panel 10 is a touch screen. A perimeter wall 55 may surround the front panel 10.

A free standing display housing 15 may surround the assembly 5 and may be configured to permit affixing the assembly 5 to the ground. In exemplary embodiments the free standing display housing 15 may be flag shaped. In still other embodiments, the free standing display housing 15 may be sized and configured to be integrated into a bus shelter.

The free standing display housing 15 may comprise a post 20, an upper beam 25, and a base 30. In exemplary embodiments, the base 30 may comprise select apertures 35, such as circular holes, that permit a fastener, such as a bolt, to pass through and thereby affix the base 30 to the ground. The number and location of the apertures 35 shown are merely an example. A bottom portion of post 20 may be buried to affix the free standing display to the ground. In some embodiments, this may be accomplished by burring said bottom portion of post 20 in concrete. The free standing display housing 15 and related components may be comprised of a metal, such as stainless steel or aluminum.

The upper beam 25 may further comprise a secondary display 40 that covers a majority of one side of the upper beam 25. In exemplary embodiments this secondary display 40 is a liquid crystal display (LCD). In other embodiments, the secondary display 40 may be a static display comprising an illumination device, such as a backlight, and a cavity to accommodate a static display, such as a poster.

A pair of elongate members 50 may extend from the top of the post 20. The elongate members 50 may be configured to further secure the free standing display housing 15, and thereby the assembly 5, in place. Any number and shape of elongate members 50 is contemplated. In exemplary embodiments, these elongate members 50 may be sized and configured to be integrated with a bus shelter.

As discussed in greater detail in the subsequent figures, the assembly 5 may further comprise a gap 45 between the perimeter wall 55 and the front panel 10 configured to permit the flow of a fluid, such as ambient air, in and out of the assembly 5. In exemplary embodiments, the assembly 5 may be configured such that the upper half of the assembly 5 permits the intake of a fluid, while the lower half of the assembly 5 permits the exhaust of said fluid, as illustrated by the flow lines. This is only an example as other embodiments may be configured such that the upper half of the assembly 5 permits the exhaust of a fluid, while the lower half of the assembly 5 permits the intake of said fluid.

Figure 2:
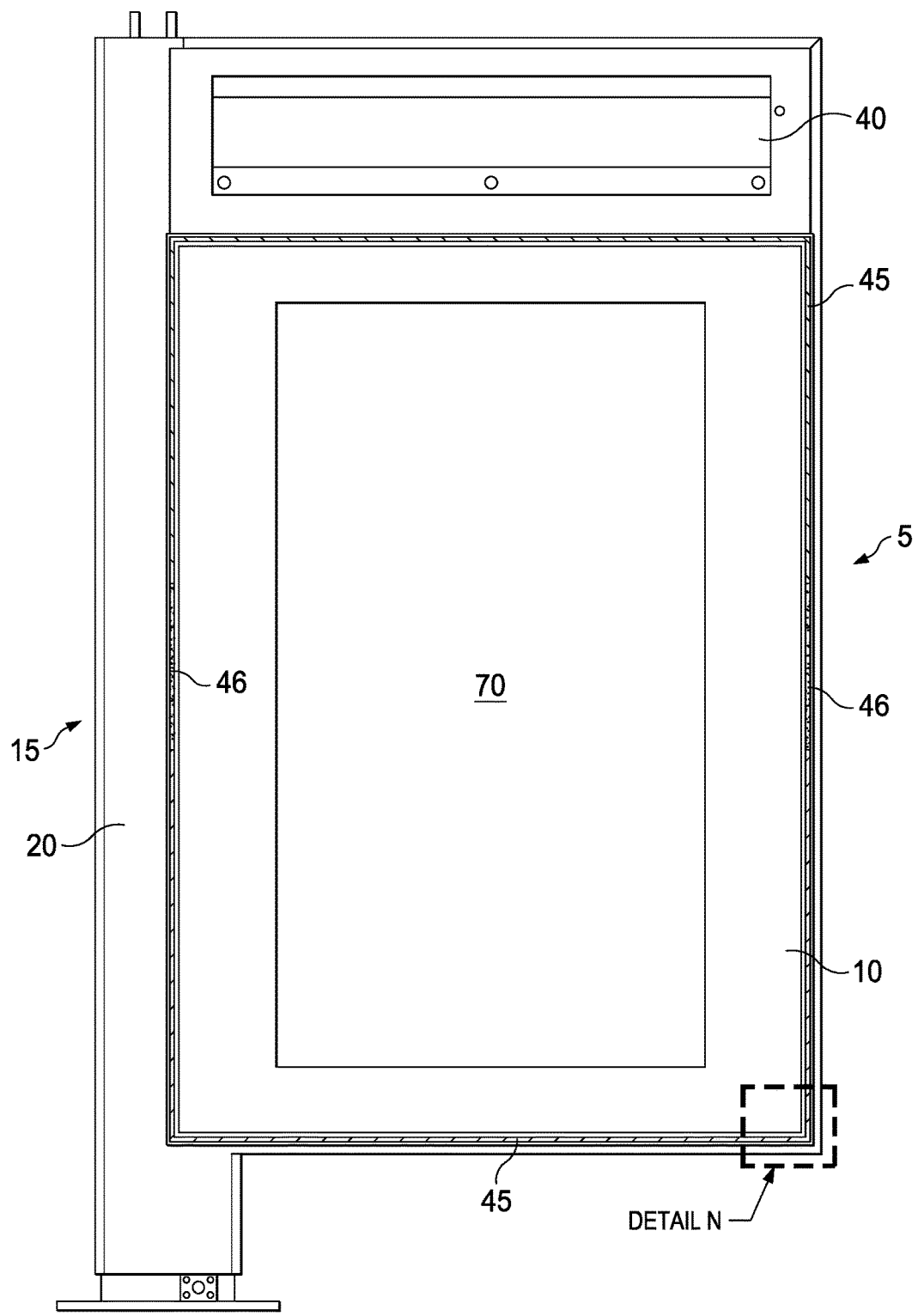
FIG. 2 is a front elevation view of the embodiment shown in FIG. 1 and indicating Detail N.
Figure 3:
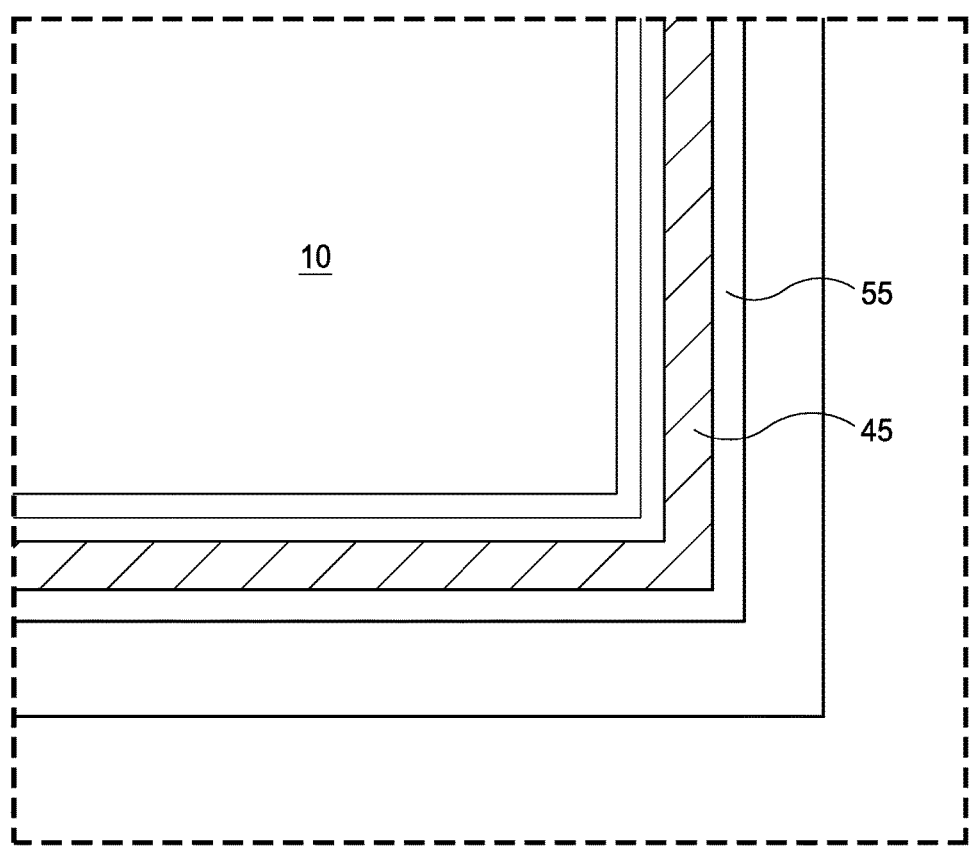
FIG. 3 is a detailed front elevation view of Detail N shown in FIG. 2.

FIG. 2 and FIG. 3 illustrates the gap 45, further indicated by the cross hatched area which has been enlarged in order to show the detail, extends along the perimeter of the assembly 5. The gap 45 may further comprise a buffer zone 46. The buffer zone 46 may be an area, preferably between the ingestion and exhaust portions of the gap 45 that does not permit the flow of external air. In other embodiments, the buffer zone 46 may substantially limit the flow of external air. In an exemplary embodiment, the gap 45 is positioned around the perimeter of the front panel 10 but is not found within the buffer zones 46. In an exemplary embodiment, the buffer zones 46 are located near the vertical centerline of the display assembly 5 and typically there is a first buffer zone on the right hand side of the assembly with a second buffer zone on the left hand side of the assembly.

Figure 4:
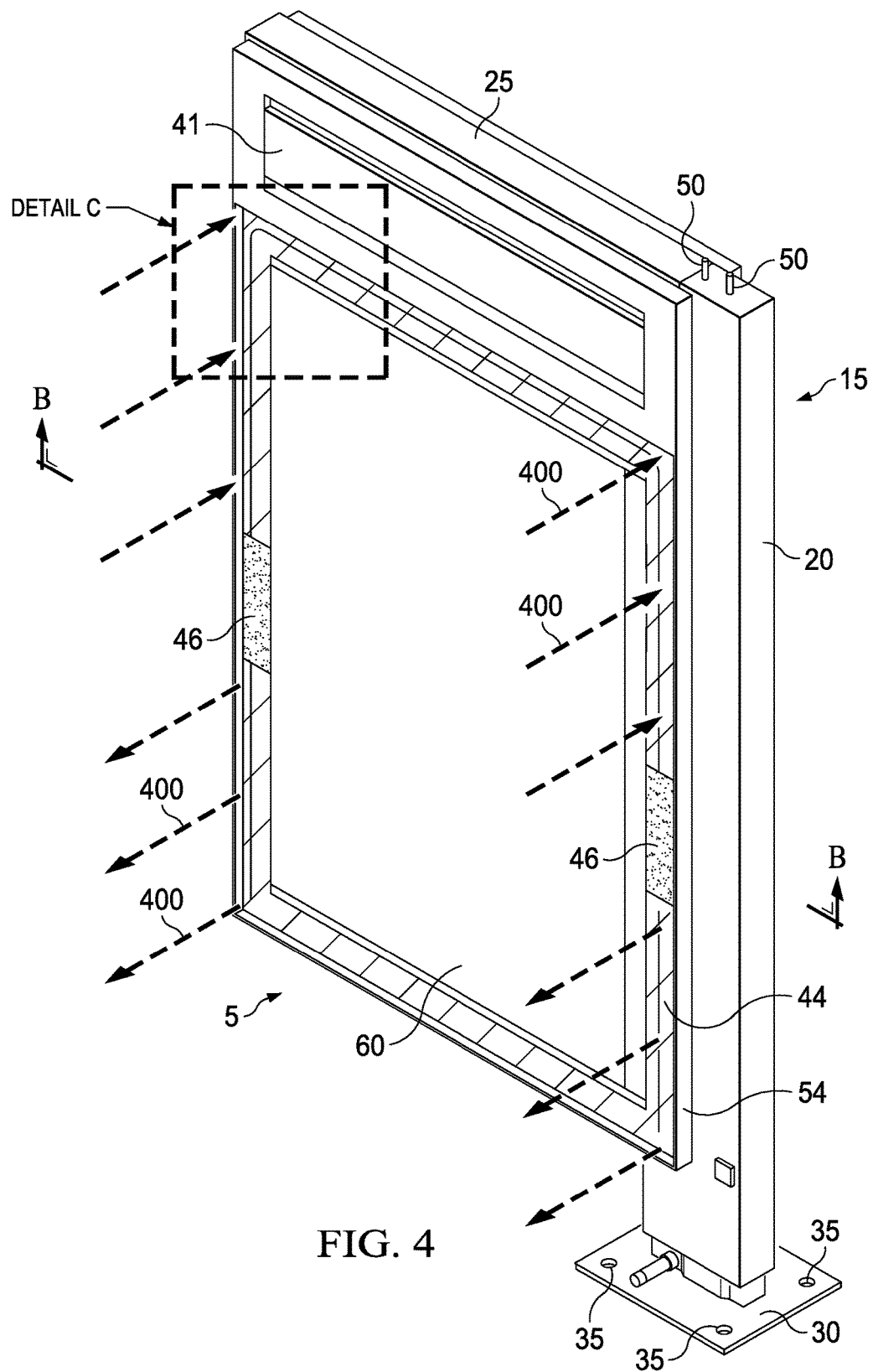
FIG. 4 is a rear perspective view of the exemplary embodiment of FIG. 1, and indicating section line B-B as well as Detail C.

In FIG. 4 the assembly 5 may further comprise a rear panel 60 that covers a majority of the rear surface of assembly 5. A rear perimeter wall 54 may surround the sides of rear panel 60. In exemplary embodiments, the rear perimeter wall 54 may be substantially the same as the perimeter wall 55. The upper beam 25 may further comprise a tertiary display 41 that may contain a backlight and graphic, similar to the secondary display 40. An illumination unit, such as a backlight, may be placed behind the rear panel 60. A cavity may be located behind the rear surface of rear panel 60 and may be configured to accommodate a static display, such as a poster, placed within or behind the rear panel 60. In alternate embodiments, an electronic display assembly (such as an LCD) may be placed behind the rear panel 60.

As discussed in greater detail in the subsequent figures, similarly to FIG. 1 the assembly 5 may further comprise a rear gap 44 between the rear perimeter wall 54 and the rear panel 60 configured to permit the flow of a fluid, such as ambient air, in and out of the assembly 5. In exemplary embodiments, the assembly 5 may be configured such that the upper half of the assembly 5 permits the intake of a fluid, while the lower half of the assembly 5 permits the exhaust of said fluid, as illustrated by the flow lines (but this could be reversed).

In exemplary embodiments of the present invention, ingestion and exhaustion of open loop fluid 400 may not take place along select portions of the rear gap 44, such as the upper and lower edges. In other embodiments, ingestion and exhaustion of open loop fluid 400 may take place along the entirety of rear gap 44, with the possible exception of the buffer zones 46.

Figure 5:
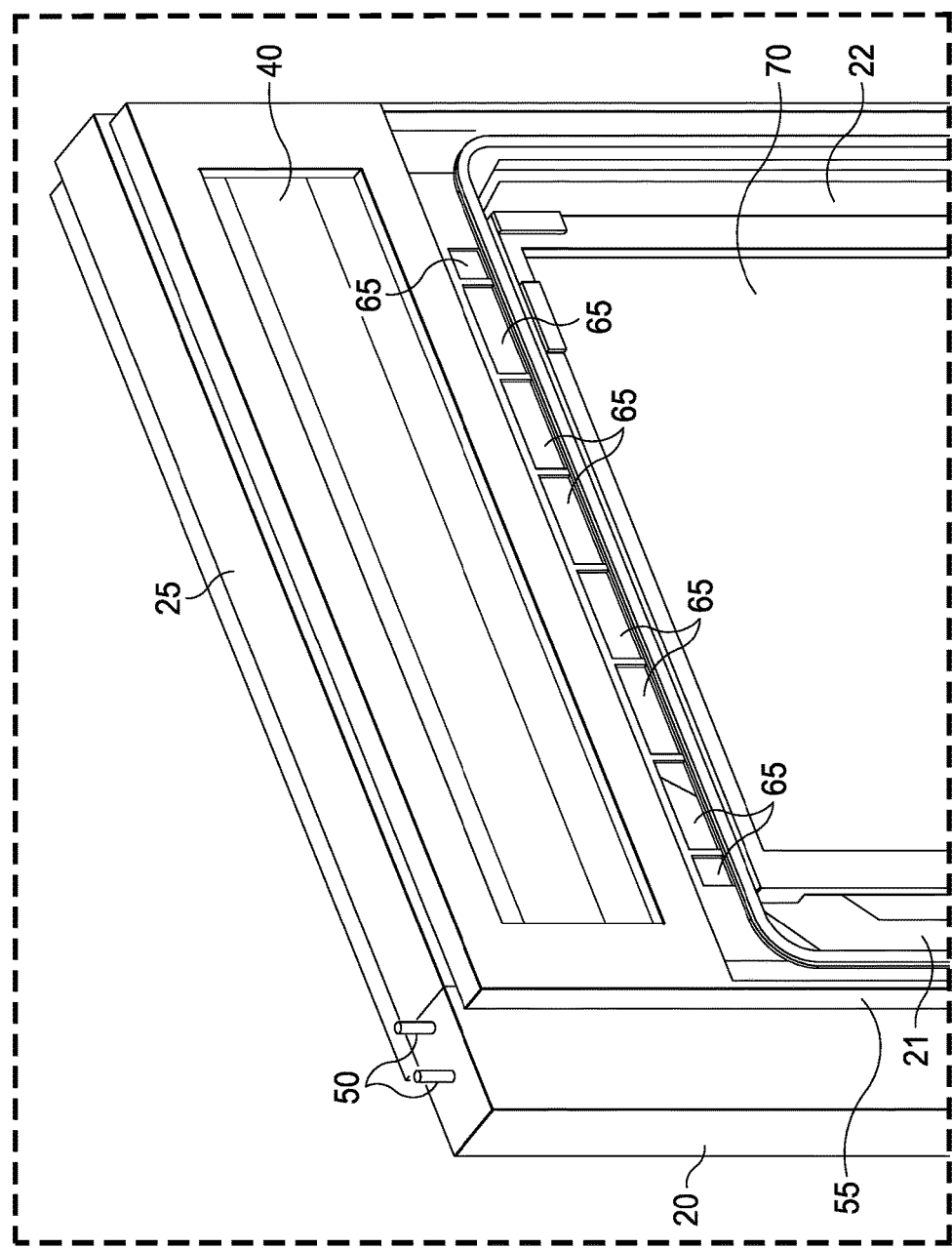
FIG. 5 is a front perspective view of Detail A shown in FIG. 1, shown with a front panel removed.

FIG. 5 illustrates the front panel 10 removed, revealing that the electronic display 70 which may be affixed behind front panel 10 and within perimeter wall 55. The assembly 5 may further comprise a series of intake apertures 65 located above the electronic display 70, between the display 70 and the secondary display 40. The illustrated intake apertures 65 are merely exemplary, any number and shape of intake apertures 65 is contemplated. The intake apertures 65 may be configured to facilitate the ingestion of a fluid, such as ambient air, into an open loop that flows behind the electronic display 70. A pair of side interior channels 21 and 22 may run the majority of the length of each side of the electronic display 70.

Figure 6:
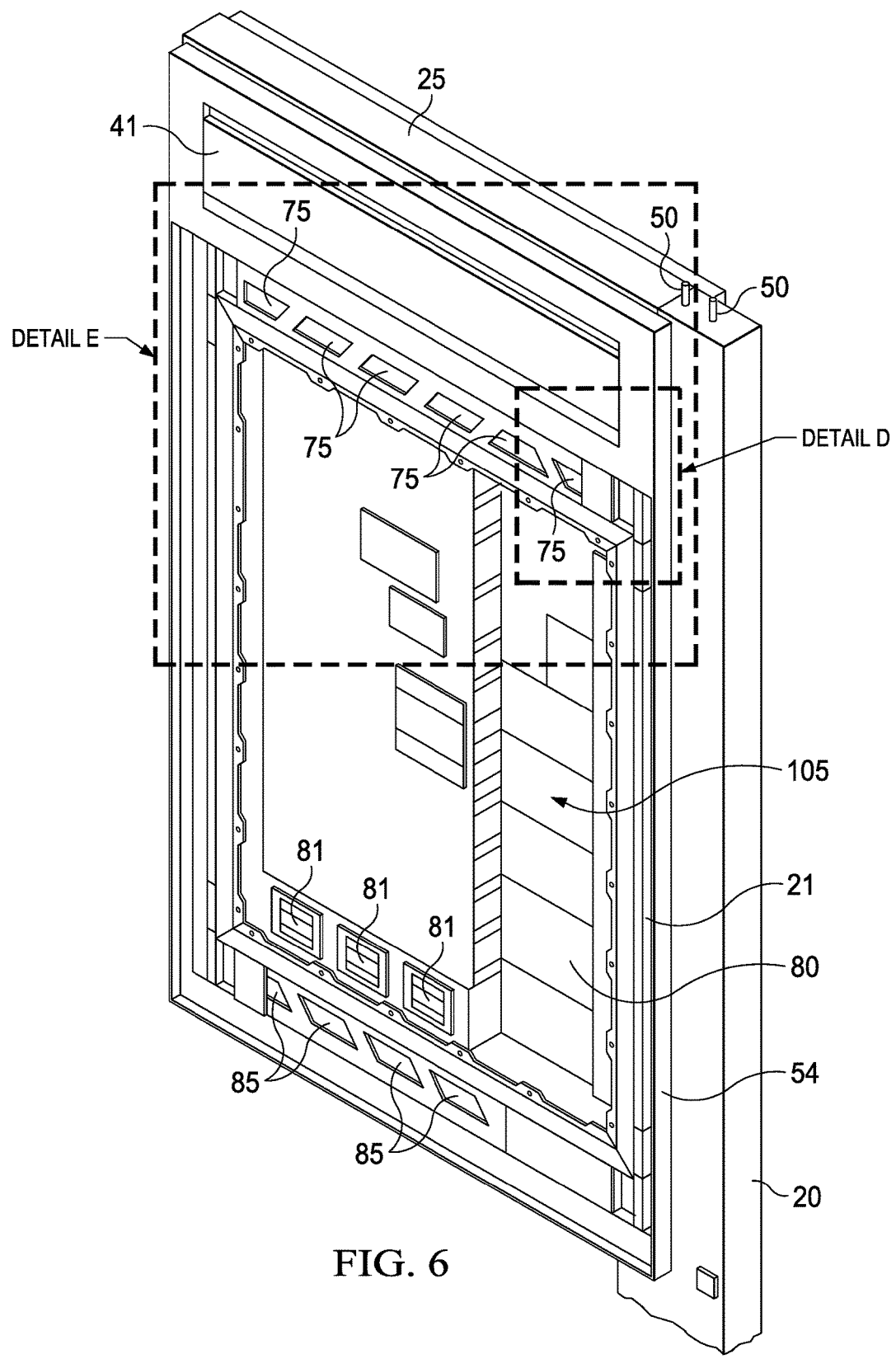
FIG. 6 is a rear perspective view of the exemplary embodiment shown in FIG. 1, where a rear panel has been removed, and indicating Detail D and Detail E.

FIG. 6 illustrates the rear panel 60 removed, revealing an interior rear panel 80 secured behind the rear panel 60. The interior rear panel 80 may cover a majority of the rear surface of the assembly 5. The assembly may contain a series of rear intake apertures 75 located above the interior rear panel 80 and sometimes within rear perimeter wall 54. The illustrated rear intake apertures 75 are merely exemplary, any number and shape of said apertures 75 is contemplated. As will be explained in greater detail in subsequent figures, the apertures 75 may be configured to facilitate the ingestion of the open loop fluid.

Similarly, the assembly 5 may further comprise a series of rear exhaust apertures 85 located below the interior rear panel 80 and sometimes within rear perimeter wall 54. The illustrated rear exhaust apertures 85 are merely exemplary, any number and shape of rear exhaust apertures 85 is contemplated. As will be explained in greater detail in subsequent figures, the rear exhaust apertures 85 may be configured to facilitate the exhaust of the open loop fluid. Optional fans 81 may be affixed behind interior rear panel 80 and above rear exhaust apertures 85. The fans 81 may be configured to control the flow of the open loop fluid. Any number of fans 81 is contemplated. In other embodiments, the fans 81 may be located at any number of locations along the open loop flow path, or any position between the intake 75 and exhaust apertures 85.

Figure 7:
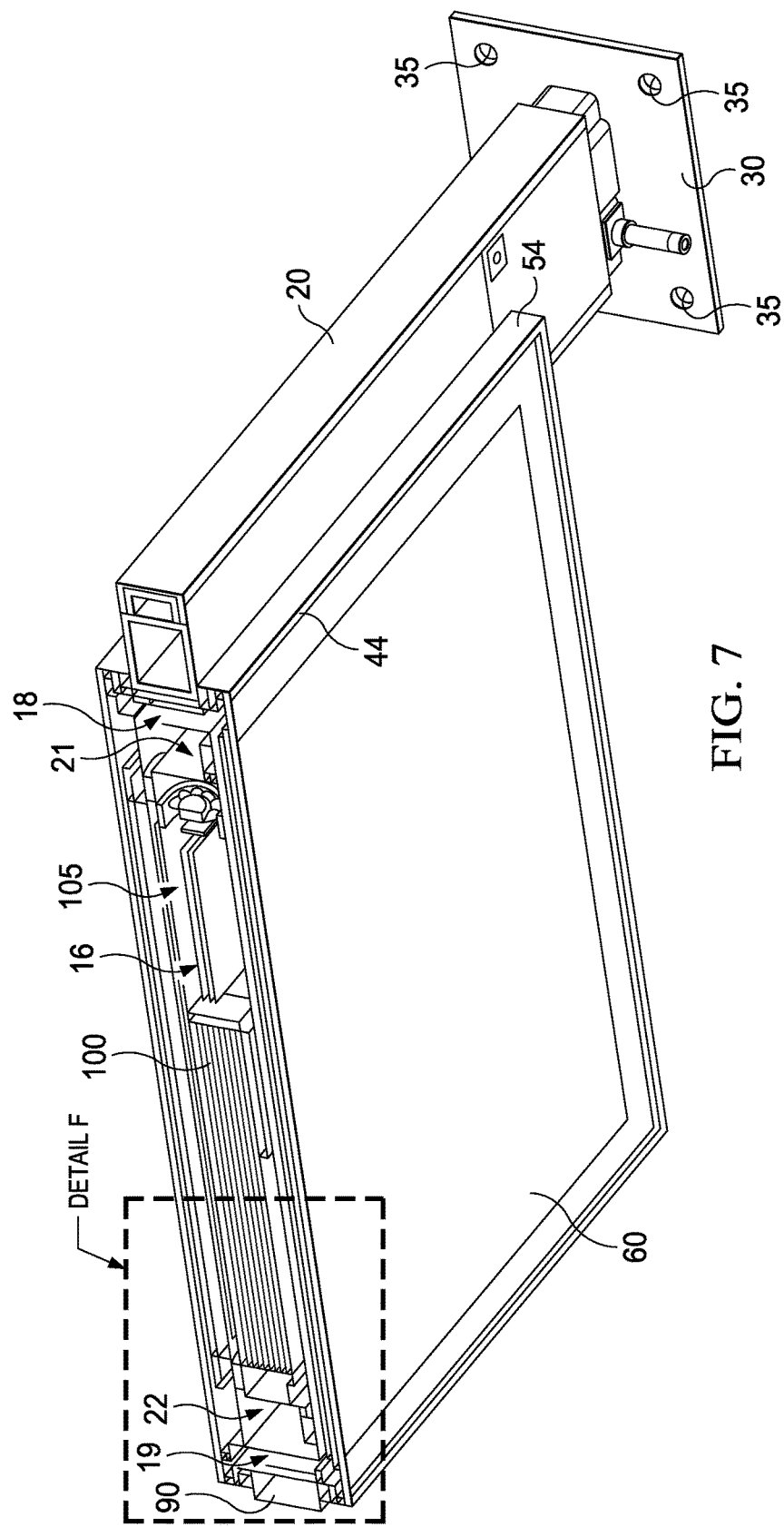
FIG. 7 is a top perspective section view taken along section line A-A of FIG. 1, and indicating Detail F.
Figure 8:
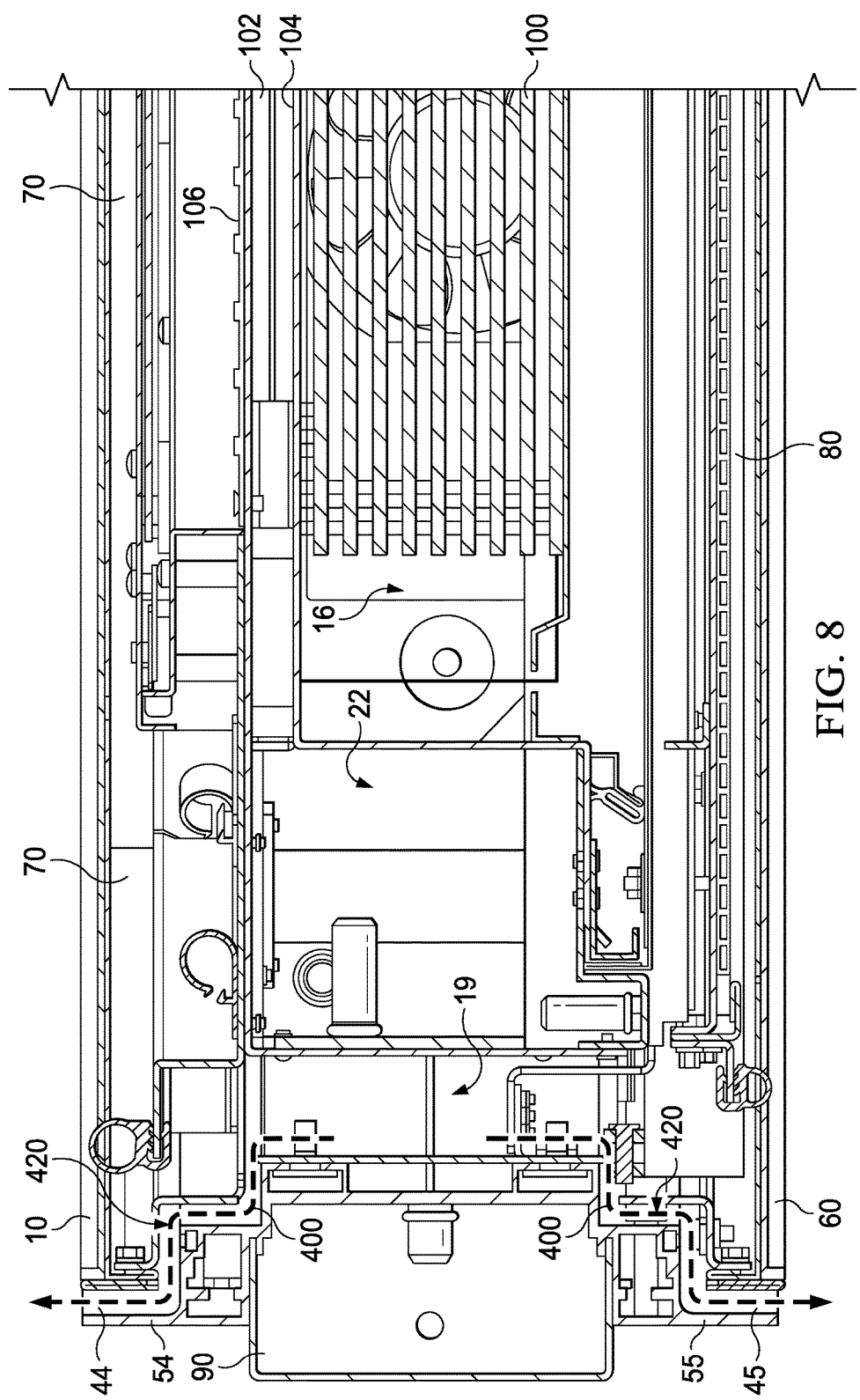
FIG. 8 is a top plan section view of Detail F shown in FIG. 7.

FIG. 7 and FIG. 8 illustrate the lower half of the assembly 5 and free standing display housing 15. A side beam 90 may be located on the opposite side of post 20 and may run a majority of the length of the assembly 5. The side beam 90 may be comprised of a metal and be configured to provide structural support and rigidity to the assembly 5. An electronics cavity 16 may be placed within the interior of the assembly 5. An optional heat exchanger 100 may be affixed within or near the electronics cavity 16. In exemplary embodiments the heat exchanger 100 may be a cross flow heat exchanger, but other types of heat exchangers can be used, especially counter flow heat exchangers and others. A series of electronic components 105 may also be affixed within the electronics cavity 16. As will be explained in greater detail in subsequent figures, open loop fluid 400, such as an external air, may circulate through the heat exchanger 100. Closed loop fluid, such as a circulating gas 700 may circulate through the electronics cavity, as well as over and through electronic components 105, and through heat exchanger 100.

As will be explained in greater detail in subsequent figures, in this embodiment open loop fluid 400 may exhaust the assembly 5 via gap 44 and optional rear gap 45 along a second gaseous pathway 420. As indicated by the flow lines, open loop fluid may follow the zigzag shaped second gaseous pathway 420 from a right side channel 19, out of the assembly 5. Alternatively, other pathway shapes may be utilized and are expressly contemplated.

When using a liquid crystal display as the electronic display 70, a backlight 106 may be placed behind the electronic display 70 and is preferably a direct lit LED backlight, but other illumination sources can be used with the exemplary embodiments. A plate 104 or other substantially planar object may be placed behind the backlight 106 in order to create a channel 102 for accepting open loop fluid 400. Preferably, the channel 102 is sealed to prevent open loop fluid 400 from entering other portions of the display assembly, specifically the electronics compartment 16.

Figure 9:
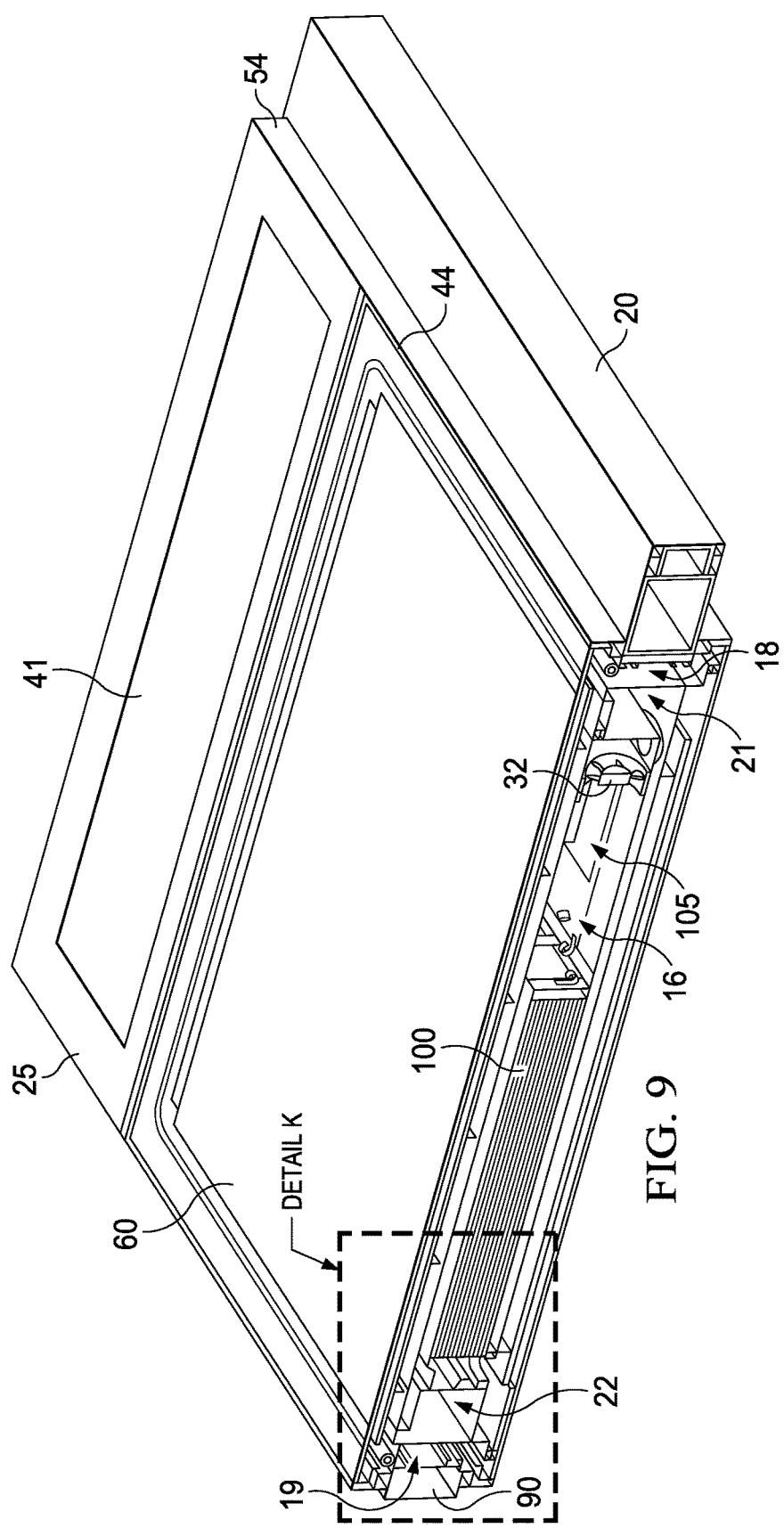
FIG. 9 is bottom perspective section view taken along section line B-B of FIG. 4, and indicating Detail K.
Figure 10:
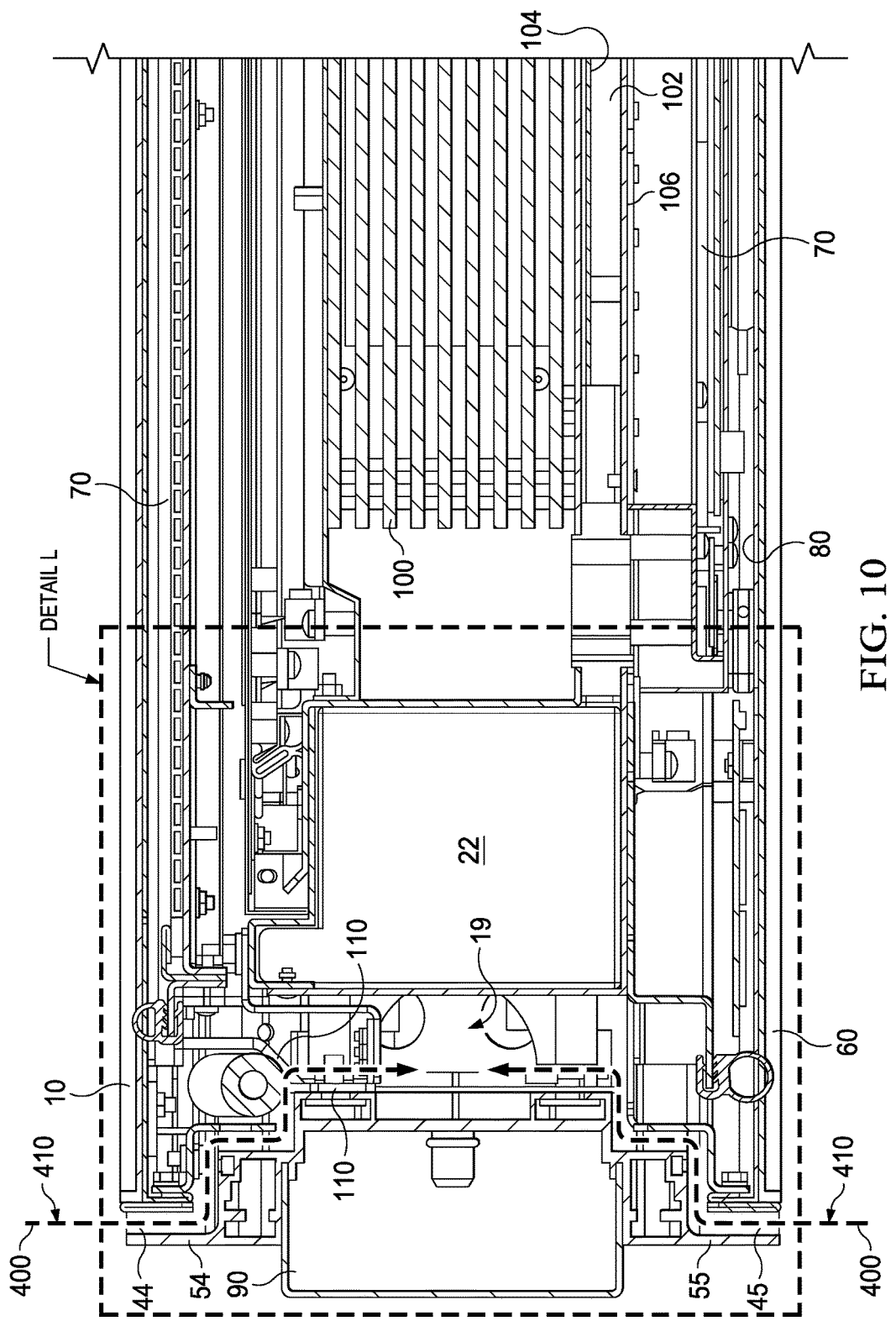
FIG. 10 is a bottom plan section view of Detail K shown in FIG. 9, and indicating Detail L.

FIG. 9 and FIG. 10 illustrate the upper half of assembly 5 and free standing display housing 15, which are similar to the lower half as shown in FIG. 5 and FIG. 6, respectively, with the exception of a pair of optional stiffeners 110. The optional stiffeners 110 will be explained in greater detail in subsequent figures. As will be explained in greater detail in subsequent figures, in this embodiment open loop fluid 400 may enter the assembly 5 via gap 44 and optional rear gap 45 along a first gaseous pathway 410. As indicated by the flow lines, open loop fluid 400 may follow the zigzag shaped first gaseous pathway 410 to the right side channel 19. Alternatively, other pathway shapes may be utilized and are expressly contemplated.

Figure 11:
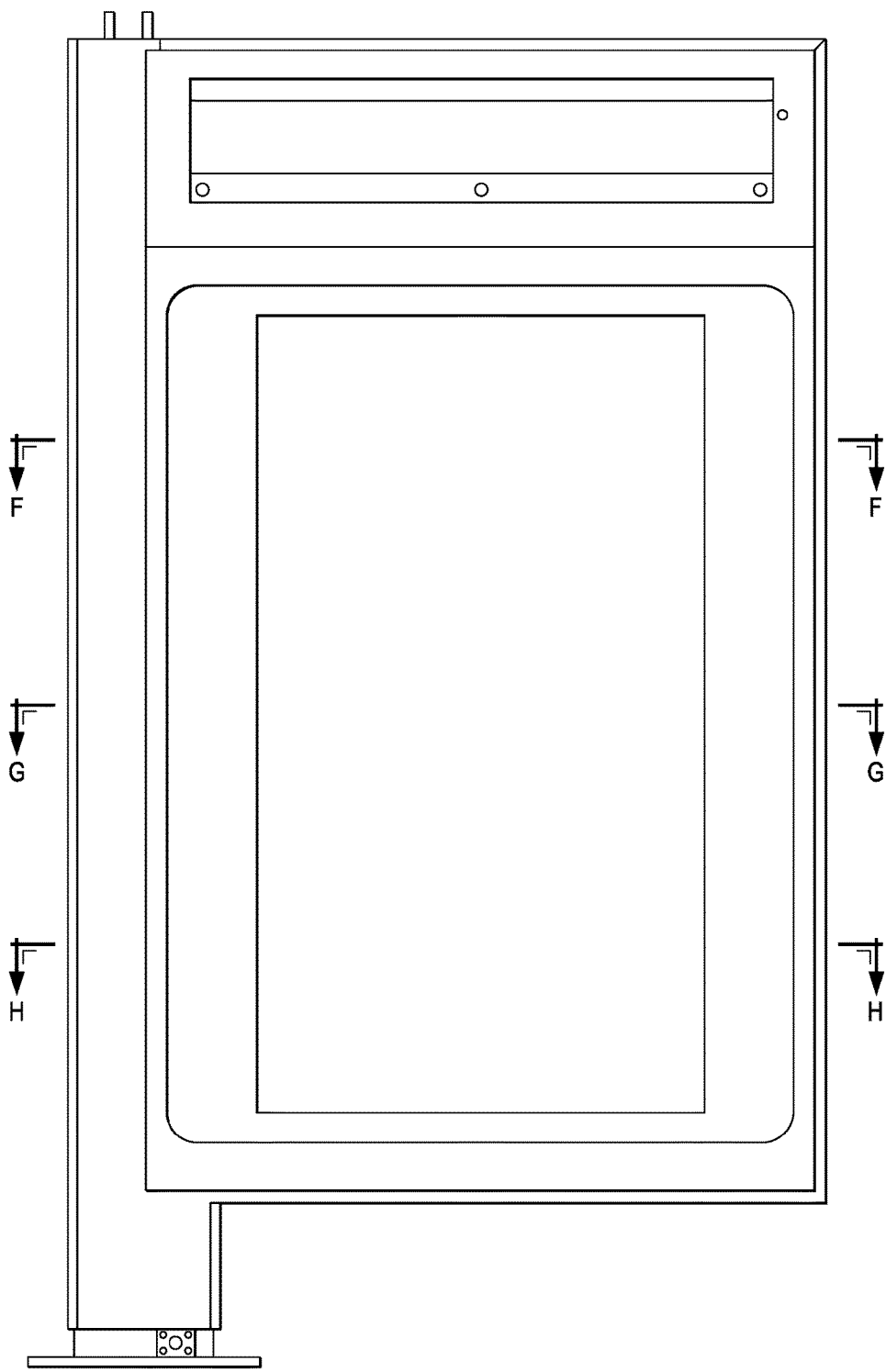
FIG. 11 is a front plan view of the exemplary embodiment shown in FIG. 1 and indicating section lines F-F, G-G, and H-H.

FIG. 11 is a front plan view of the assembly of FIG. 1 and indicates section lines F-F, G-G, and H-H.

FIG. 12A and FIG. 12B illustrates, as will be explained in greater detail in subsequent figures, a pair of channel septums 130 and a central septum 140 are preferably positioned substantially horizontally and near the vertical centerline of the assembly 5, although embodiments could also place them near the top or bottom of the assembly 5, away from the vertical centerline.

In this embodiment, FIG. 12A shows the area of the gap 45 (and optional rear gap 44) that is designated as the intake of the open loop fluid 400.

Figure 12C:
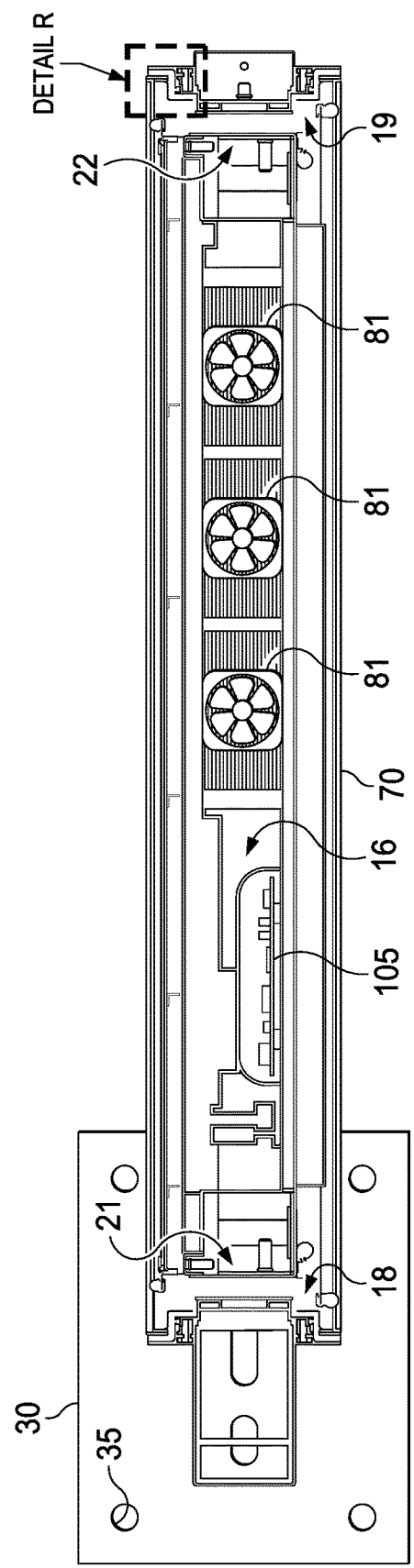
FIG. 12C is a top plan section view taken along section line H-H of FIG. 11, and indicating Detail R.

Also shown in these figures, as well as FIG. 12C is the fan 81, which is positioned to cause the flow of open loop fluid 400 into the portion of gap 45 (and optional rear gap 44) that is generally used as in intake for ambient air (filtered or unfiltered), down the left side interior channel 21 (intake channel), across/through channel 102, down the right side interior channel 22, and exhausting out of the portion of the gap 44 (and optional rear gap 45) that is used as an exhaust for the fluid 400. It should be noted that the left and right side interior channels 21 and 22 are optional as an alternative embodiment would include the following path for open loop fluid 400: into the portion of gap 45 (and optional rear gap 44) that is generally used as in intake for ambient air (filtered or unfiltered), across/through channel 102, and exhausting out of the portion of the gap 45 (and optional rear gap 44) that is used as an exhaust for the fluid 400.

FIG. 12C is a top sectional view taken along section line H-H of FIG. 11 and indicates Detail R. In this embodiment, this figure shows the area of the gap 45 (and optional rear gap 44) that is designated as the exhaust of the open loop fluid 400.

Figure 13A:
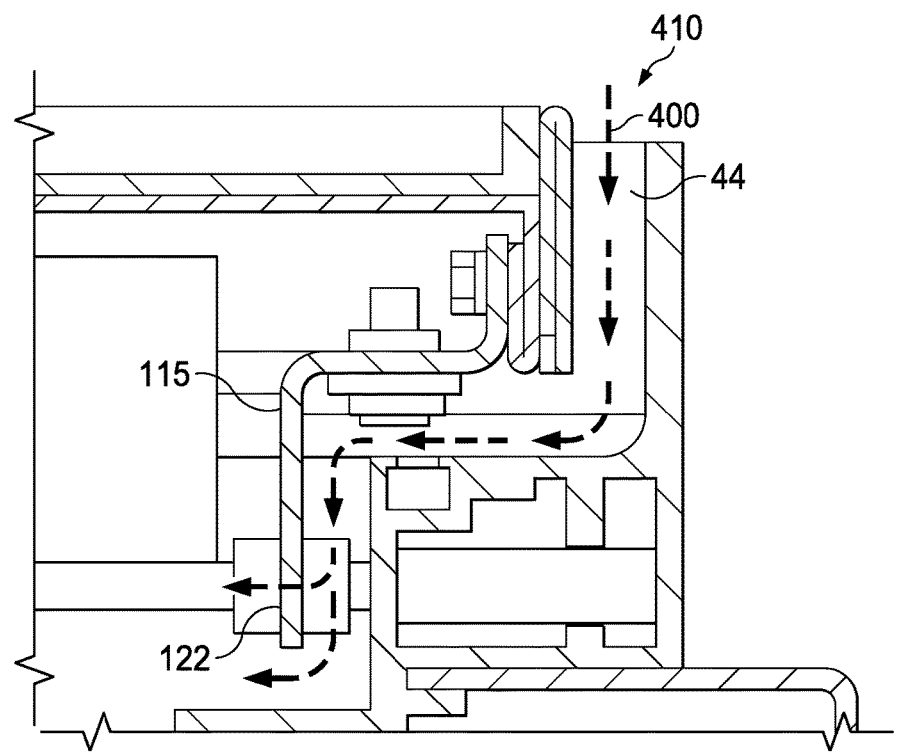
FIG. 13A is a top plan detailed section view of Detail O in FIG. 12A.

FIG. 13A illustrates the ingestion of open loop fluid 400 via rear gap 44. The open loop fluid 400 may pass through an optional door stiffener 115 via aperture 122. The open loop fluid 400 may travel along the first gaseous pathway 410.

Figure 13B:
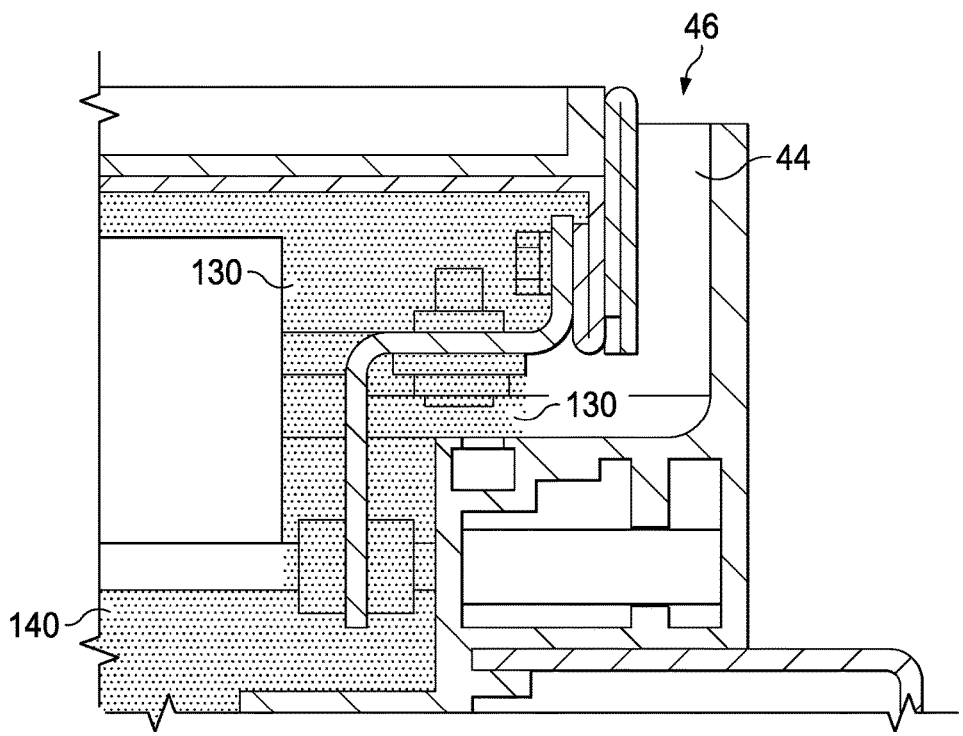
FIG. 13B is a top plan detailed section view of Detail Q in FIG. 12B.

FIG. 13B illustrates an exemplary embodiment of the assembly within the region of the optional buffer zone 46. In this embodiment, buffer zone 46 may comprise essentially an area at, near, or within the gap 45 (and optional rear gap 44) that contains one or more fluid-blocking plugs which are placed along the path of open loop fluid 400 so that it may not pass through in any substantial amount. In exemplary embodiments, the buffer zone 46 would contain the channel septums 130 along with the central septum 140, but some embodiments would utilize only the channel septum 130 (if the embodiment does not permit fluid 400 to flow through the door stiffeners). In some embodiments, rather than placing the channel septums 130 within the right and left side channels 18 and 19, the buffer zone 46 may contain a plug that is positioned near or at the end of the gap 44. Generally speaking, the buffer zone is horizontal and is placed near the vertical centerline of the assembly 5, although it could be placed near the top or bottom of the assembly 5.

It is notable that the buffer zone 46 should exist on both lateral sides of the assembly 5, as well as both on the front and rear of the assembly 5 (if using the rear gap 44) such that the buffer zone 46 blocks a portion of the front gap 45 (and the rear gap 44) on both the right and left sides of the assembly 5.

Figure 13C:
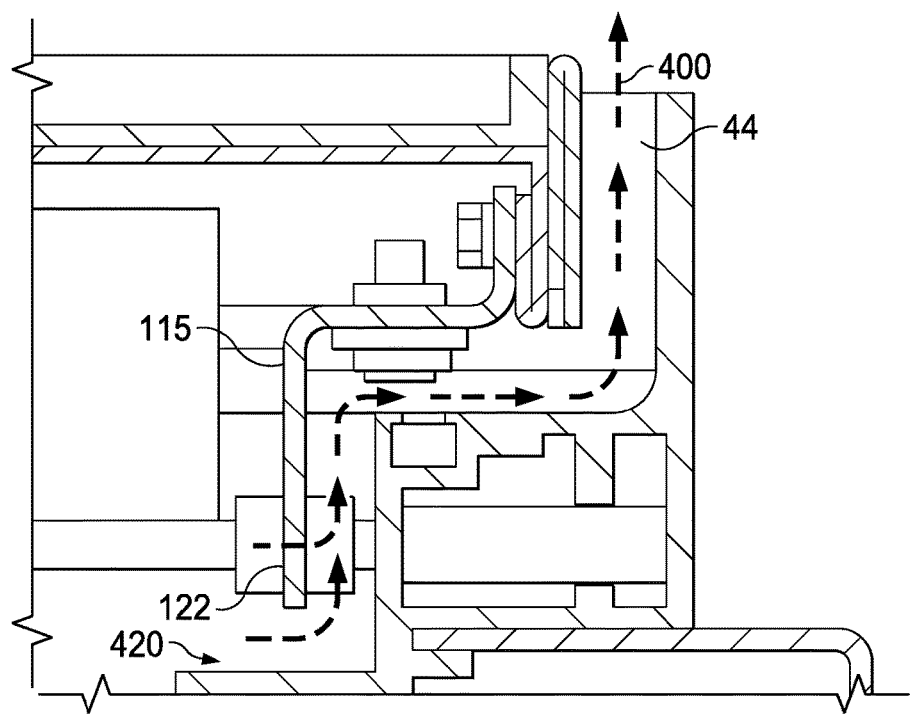
FIG. 13C is a top plan detailed section view of Detail R in FIG. 12C.

FIG. 13C illustrates the exhaustion of open loop fluid 400 via rear gap 44. The open loop fluid 400 may pass through a door stiffener 115 via aperture 122. The open loop fluid 400 may travel along the second gaseous pathway 420.

It should be noted that although FIGS. 13A-13C illustrate the rear gap 44, in an exemplary embodiment the front gap 45 has a similar orientation as to the rear gap 44. It has not been shown here as it would be substantially duplicative.

Figure 14:
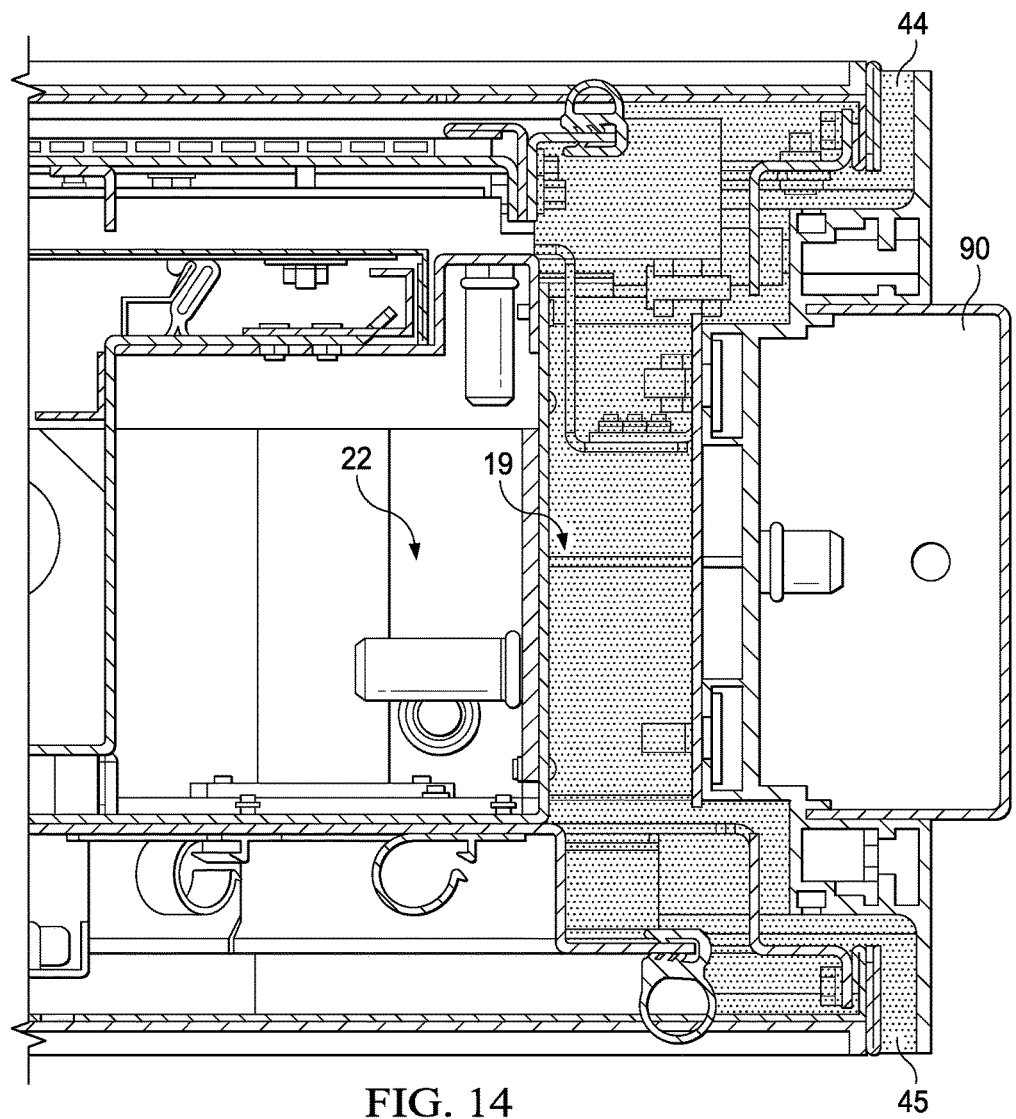
FIG. 14 is a top plan detailed section view of Detail P in FIG. 12A.

FIG. 14 illustrates the combined areas of the gap 45 and the rear gap 44, as indicated by the cross hatched area. In exemplary embodiments, outside of the buffer zone 46, the cross hatched area allows the flow of open loop fluid 400 either into or out of the gap 45 (and the optional rear gap 44).

Figure 15:
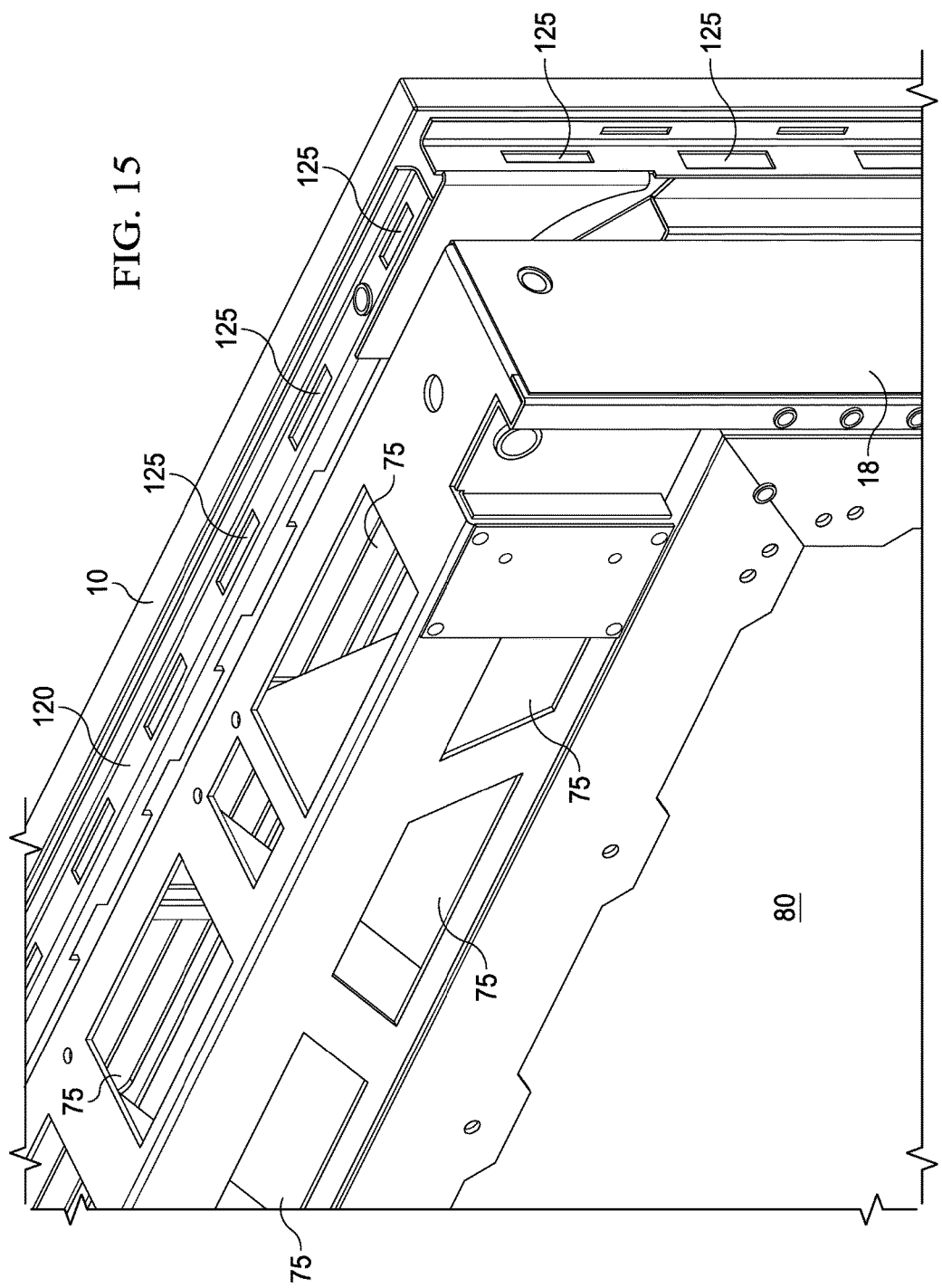
FIG. 15 is a rear perspective view of Detail D shown in FIG. 6, shown with the free standing display housing removed.

FIG. 15 illustrates the assembly 5 in isolation from the free standing display housing 15. A door stiffener 120 may be affixed immediately behind the front panel 10. In some embodiments, the door stiffener 120 may be affixed to a rear surface of the front panel 10. The door stiffener 120 may run substantially the perimeter of the front panel 10. The door stiffener 120 may be comprised of a metallic or other material suitably rigid to provide structural rigidity and strength to the assembly 5. The door stiffener 120 may comprise a series of apertures 125 that permit the flow of open loop fluid 400. The illustrated door stiffener apertures 125 are merely exemplary. Any number and shape of apertures 125 are contemplated.

Figure 16:
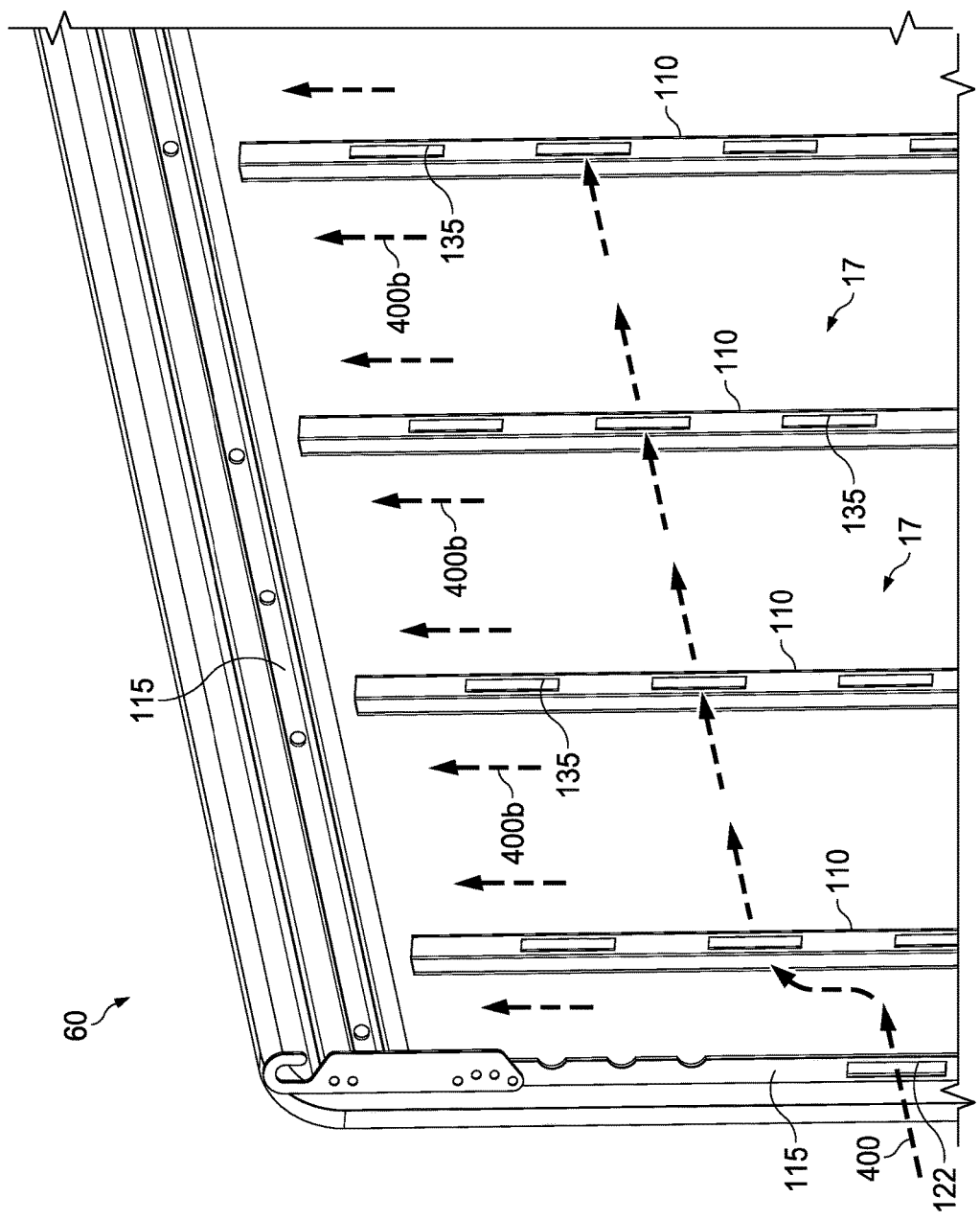
FIG. 16 is a front perspective view of Detail C shown in FIG. 4 of the rear panel, shown in isolation from the surrounding components.

FIG. 16 illustrates the rear panel 60 in isolation. In exemplary embodiments, rear door stiffeners 115 may be affixed around the perimeter edges of the rear panel 60, thereby framing rear panel 60. A door cavity 17 may be defined by the space between the rear panel 60, the interior surfaces of rear door stiffeners 115, and the interior rear panel 80 (not shown in the current figure). Open loop fluid 400 ingested via the rear gap 44 may be considered open loop fluid 400b once it travels through the rear door stiffeners 115 via apertures 122 into the door cavity 17. The illustrated apertures 122 are merely exemplary, any number and shape of apertures is contemplated. Optional stiffeners 110 in the form of elongate members may extend substantially the length of the rear panel 60. The optional stiffeners 110 may be comprised of a metal, a polymer, or other material suitably rigid to provide structural rigidity and strength to the rear panel 60. The optional stiffeners 110 may comprise a series of apertures 135 that facilitate open loop fluid 400b to flow through the optional stiffeners 110. The illustrated optional stiffeners 110 and the apertures 135 are merely exemplary, any number and shape of the optional stiffeners 110 and the apertures 135 is contemplated.

The portion of the open loop fluid 400 traveling in the door cavity 17 is referred to as open loop fluid 400b. As shown, open loop fluid 400b may pass behind the interior panel 80 and be ingested via the intake apertures 75 in order to be directed towards the channel 102. In an exemplary embodiment, the fluid 400b would flow through intake apertures 75 and be directed into left side channel 18, which distributes the fluid 400b across the channel 102, and exhausted out of right side channel 19.

Figure 17:
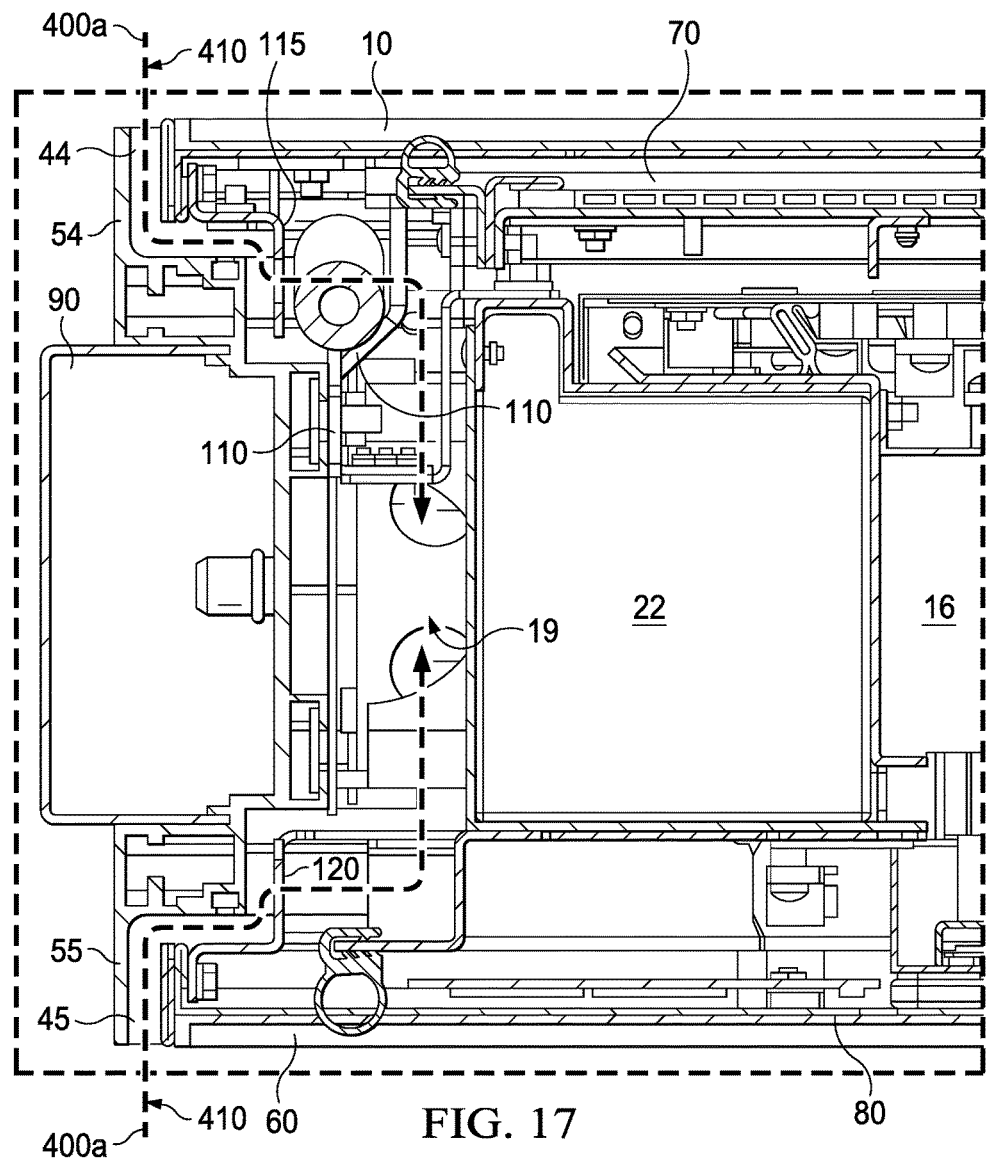
FIG. 17 is a bottom plan section view of Detail L shown in FIG. 10.

FIG. 17 illustrates, via flow lines, the circulation of open loop fluid 400a through the front and rear of assembly 5. Open loop fluid may be ingested via the gap 45, travel through the door stiffener 120 via the apertures 125 and travel vertically through the right side channel 19 sometimes defined in part by the right side interior channel 22 and side beam 90. Similarly, the open loop fluid 400a may be ingested via the rear gap 44, travel through the door stiffener 115 via the apertures 122, through optional stiffeners 110 via aperture 135, and enter the right side channel 19. On the opposite side of the assembly 5, a similar route may be taken whereby the open loop fluid ultimately enters a left side channel 18 sometimes defined in part by the left side interior channel 21 and post 20.

A substantially identical flow path in reverse may be taken for exhaustion of the open loop fluid at on the opposite end of the assembly 5. Again, in exemplary embodiments, ingestion takes place in the upper half or assembly 5 and exhaustion takes place in the lower half of assembly 5. In other embodiments, ingestion takes place in the lower half and exhaustion in the upper half of the assembly 5. In still other embodiments, ingestion may take place on the right side while exhaustion takes place on the left side with the buffer zone 46 placed at the top and bottom edges of the assembly to prevent cross inhalation of the two flow paths.

Figure 18:
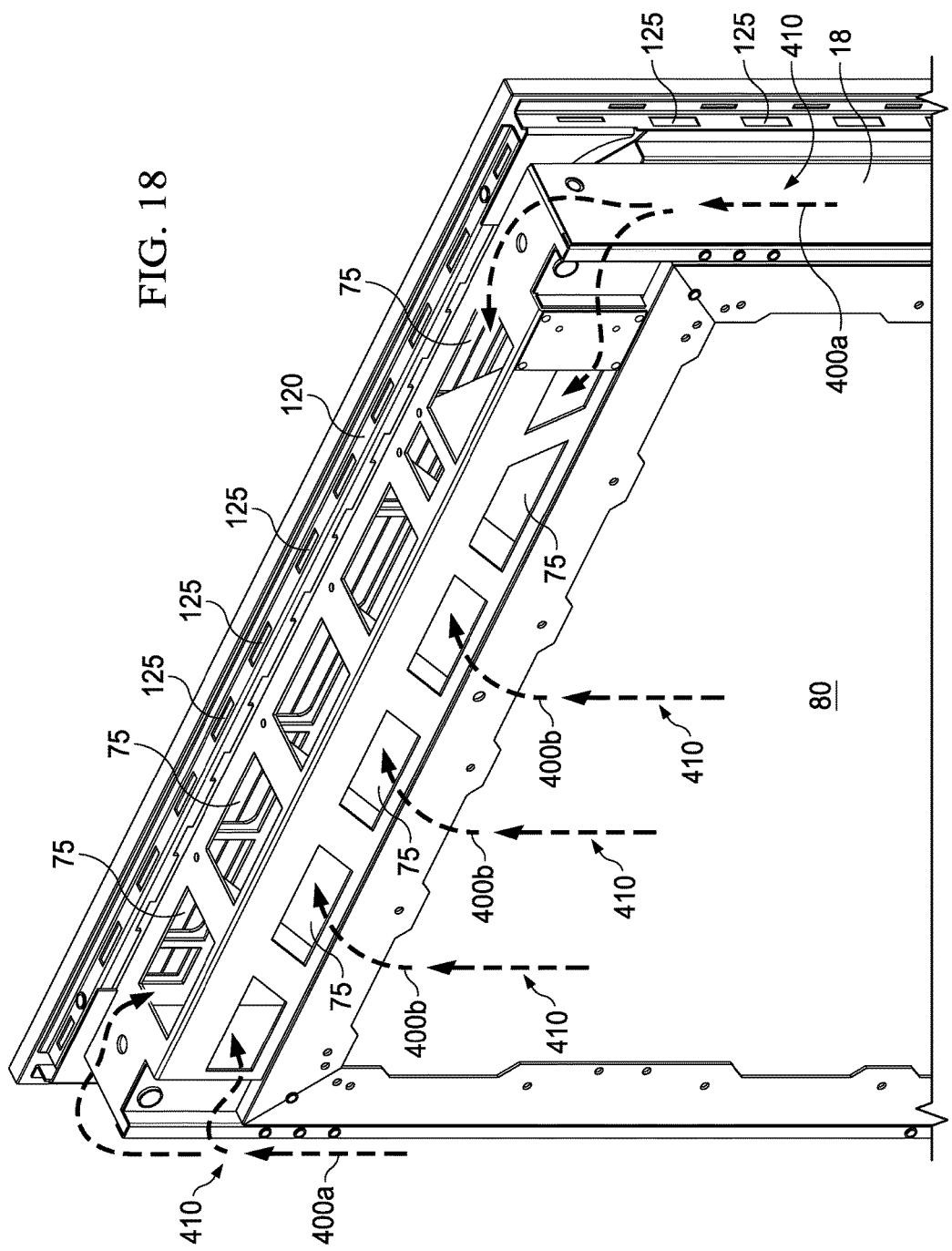
FIG. 18 is a rear perspective view of Detail E shown in FIG. 6, shown with the free standing display housing removed.

FIG. 18 illustrates an exemplary flow path for the open loop fluid 400 after being ingested via the gap 45 and the rear gap 44. In exemplary embodiments, this path may comprise the first gaseous pathway 410. The open loop fluid 400 which is ingested via the rear gap 44 may travel along the door cavity 17 between the optional door stiffeners 110 and can be referred to as the open loop fluid 400b. The open loop fluid 400b may then travel vertically along the rear interior panel 80 and be ingested via the rear intake apertures 75. Other portion of open loop fluid 400 may travel along the left side channel 18 and the right side channel 19 and be referred to as the open loop fluid 400*a*. After traveling vertically through the side channels 18 and 19, the open loop fluid 400*a* may travel over the top of said channels and be ingested via the intake apertures 75. Similarly, the open loop fluid 400 may be ingested via the gap 45, travel through the door stiffener apertures 125 below front panel 10, and be ingested via the intake apertures 65.

Figure 19A:
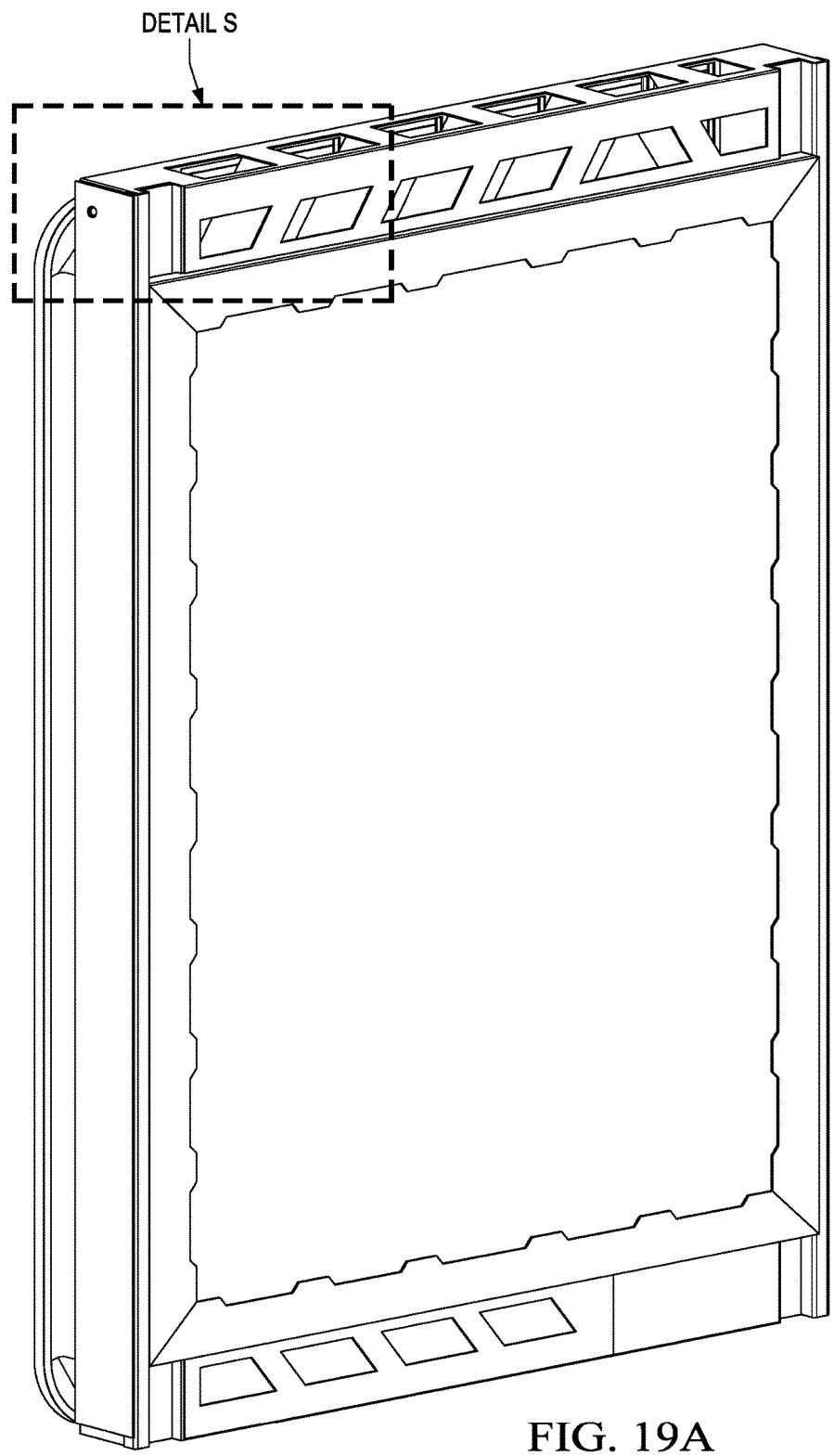
FIG. 19A is a rear perspective view of the assembly of FIG. 1, shown with the free standing display housing removed, and indicating Detail S.

FIG. 19A illustrates a rear perspective view of the assembly of FIG. 1 shown in isolation from the free standing display 15 and indicating Detail S.

Figure 19B:
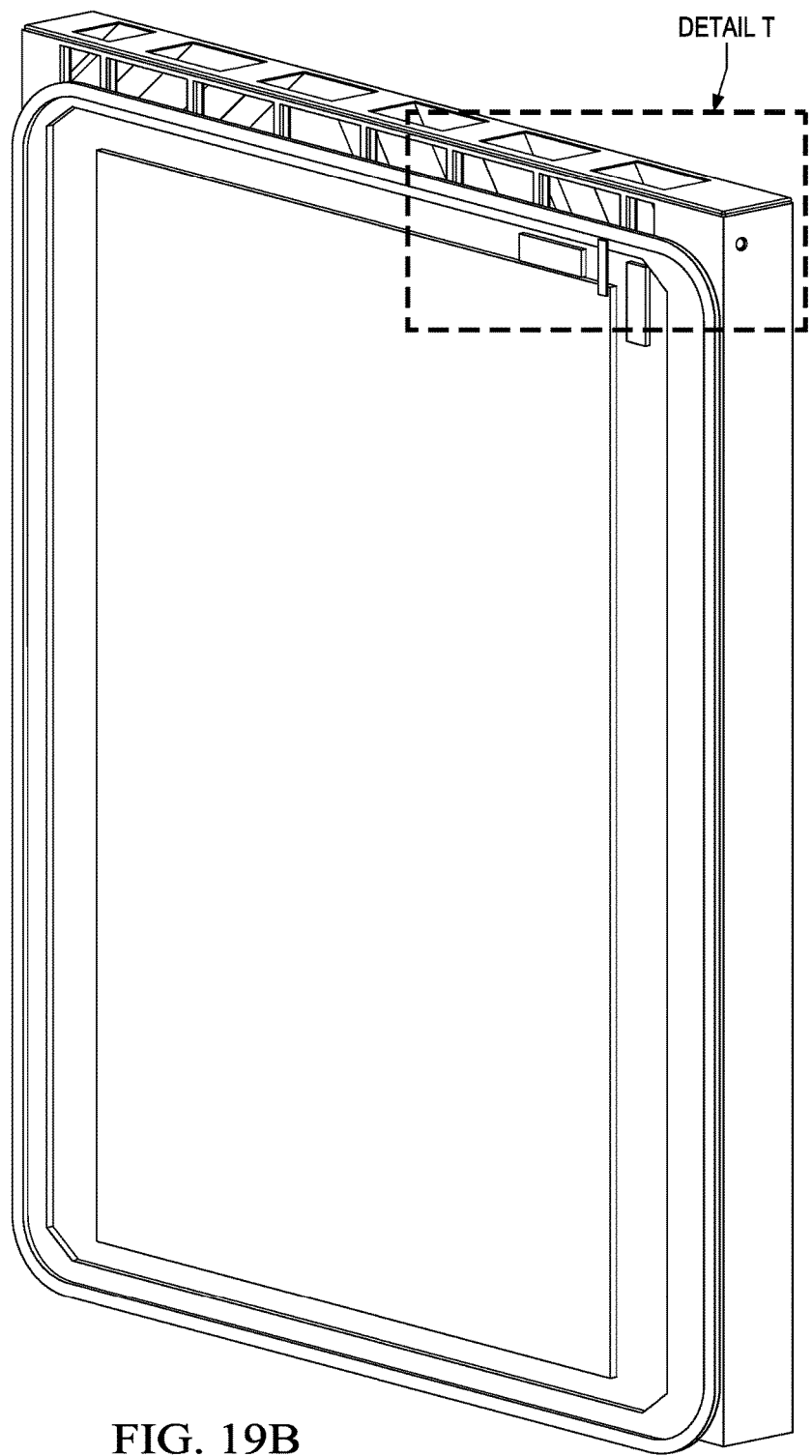
FIG. 19B is a front perspective view of the assembly of FIG. 1, shown with the free standing display housing and front panel removed, and indicating Detail T.

FIG. 19B illustrates a front perspective view of the assembly of FIG. 1 shown in isolation from the free standing display 15 and indicating Detail T.

Figure 20:
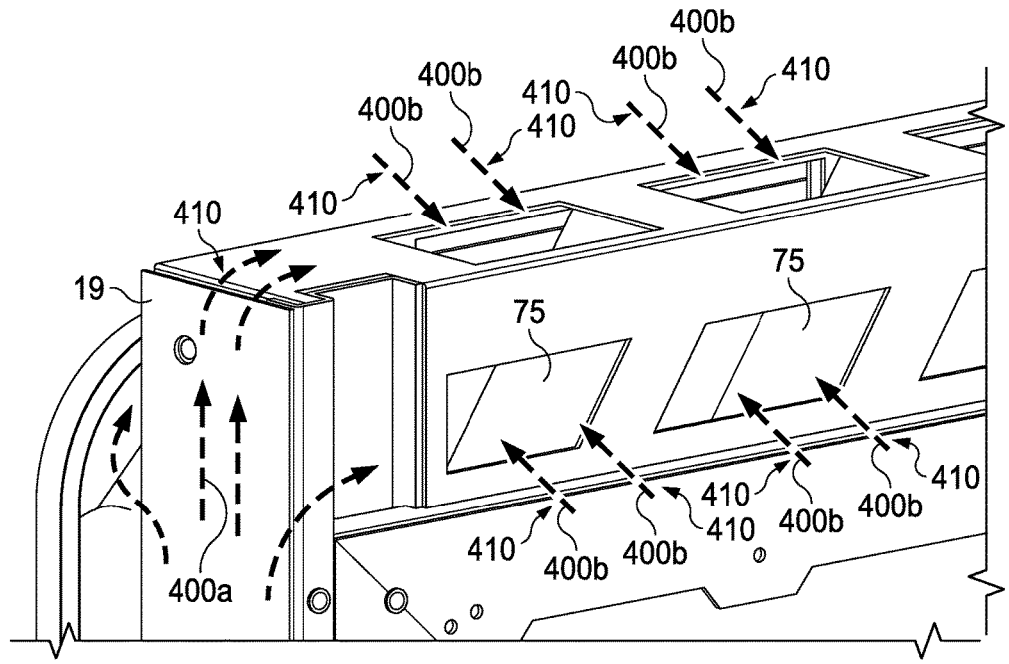
FIG. 20 is a rear perspective detail view of Detail S shown in FIG. 19A.

FIG. 20 illustrates that the portion of open loop fluid 400 traveling in the right side channel 19 is referred to as open loop fluid 400*a*. The open loop fluid 400*a* may travel inside the right side channel 19, over the top of the right side interior channel 22, and into the intakes apertures 75.

Figure 21:
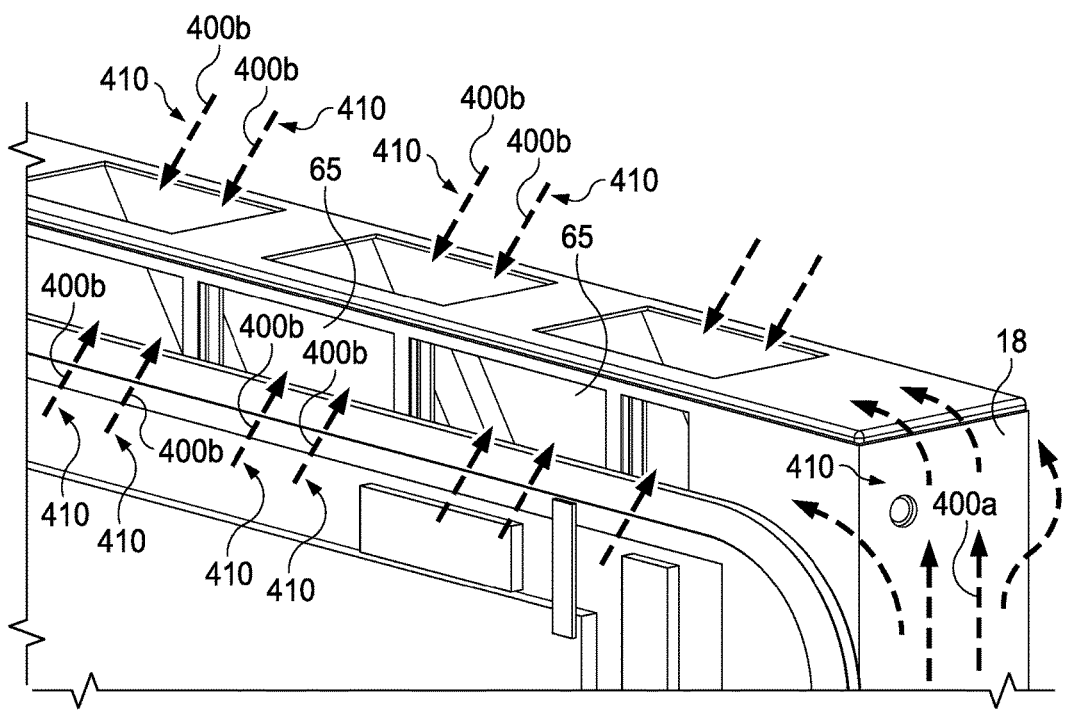
FIG. 21 is a front perspective detail view of Detail T shown in FIG. 19B.

FIG. 21, similar to FIG. 20 but shown from a front perspective, illustrates that the portion of open loop fluid 400 traveling in the left side channel 18 is referred to as open loop fluid 400*a*. The open loop fluid 400*a* may travel inside the left side channel 18, over the top of the left side interior channel 21, and into the intakes apertures 65.

Figure 22:
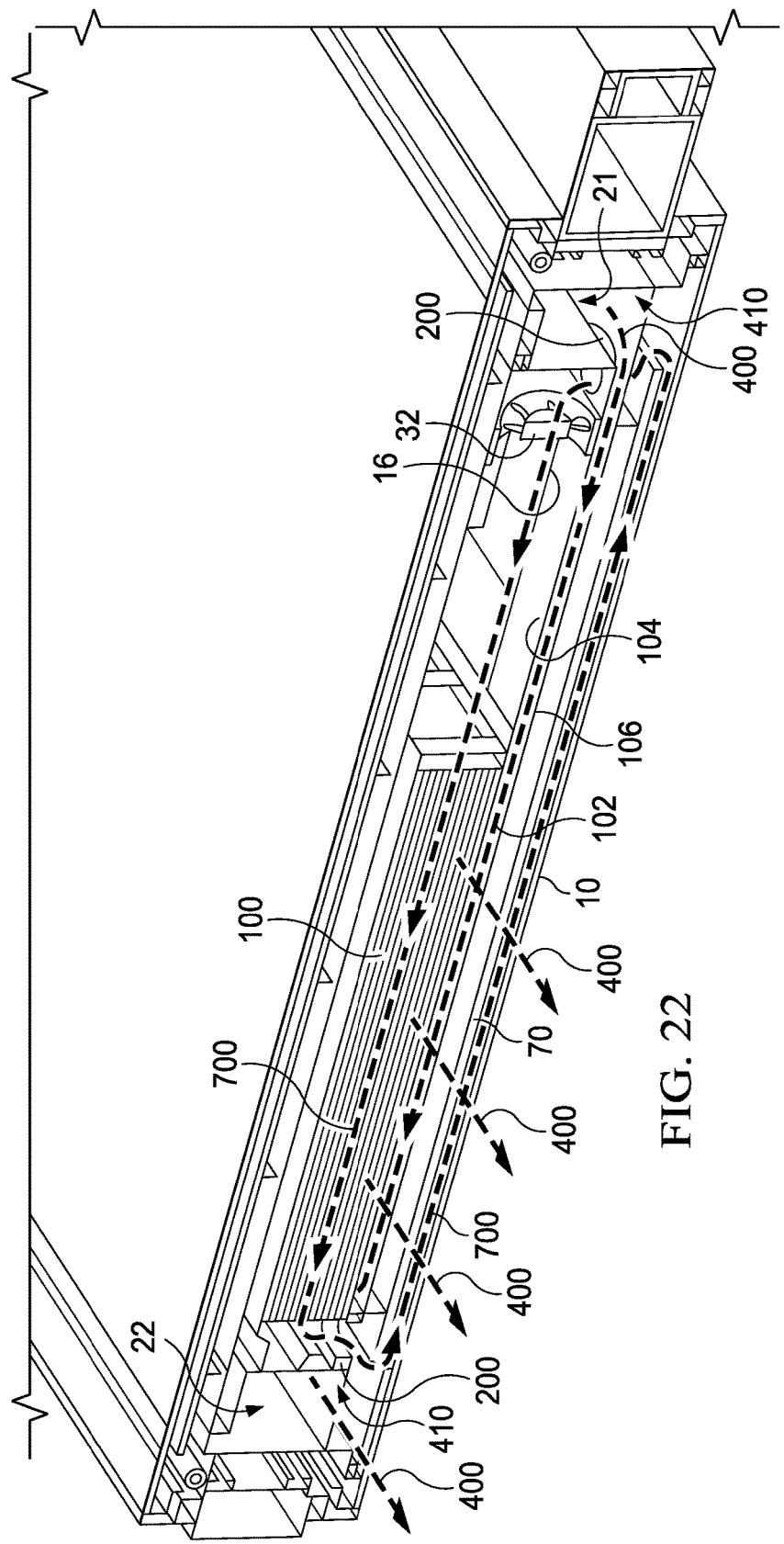
FIG. 22 is bottom perspective section view taken along section line B-B of FIG. 4

FIG. 22 is bottom perspective section view taken along section line B-B of FIG. 4. Once the open loop fluid 400*a*/400*b* is ingested via the various intake apertures 75 and 65, it is combined and then apportioned between a first portion of open loop fluid 400 which travels through the open loop gas pathways of the heat exchanger 100, and a second portion of open loop fluid 400 which is directed through the channel 102.

One or more circulating fans 32 are used to force circulating gas 700 across the electronic components and through the closed loop gas pathways of the heat exchanger 100, as well as between the electronic display 70 and the front panel 10, forming a closed loop. In this embodiment, the circulating gas 700 passes through the opening within the pass through gasket 200 while the open loop fluid 400 travels around the pass through gasket, substantially ensuring that the open loop fluid 400 and circulating gas 700 do not mix. This design can be flipped however, where, the circulating gas 700 travels around the pass through gasket 200 while the external air 400 travels through the pass through gasket 200.

A portion of the flow of open loop fluid 400 is shown traversing the left fight side interior channel 21 and passing by the cross through gasket 200 in order to enter the channel 102 that runs behind the electronic display 70 (here behind the backlight 106). The channel 102 is preferably defined as the space between the rear surface of the electronic display 70 (here behind the backlight 106) and a plate 104. A preferably corrugated and preferably continuous heat sink is ideally placed within the channel in order to facilitate the conductive transfer of heat from the electronic display 101 to the continuous heat sink, to be removed by convection with the open loop fluid 400.

The heat exchanger 100 preferably contains a plurality of layers that define channels that contains either circulating gas 700 or open loop fluid 400. Preferably, the circulating gas 700 is not permitted to mix with the open loop fluid 400.

The flow of open loop fluid 400 travels through the channel 102 and again passes around the pass through gasket 200 to enter the left side interior channel 22, eventually being directed out of the portions of the gap 45 (and the optional rear gap 44) which have been designated for exhaustion of the fluid 400. In this embodiment, the circulating gas 700 is shown exiting the heat exchanger 100 and passing through the opening within the pass through gasket 200 and then between the electronic display 70 and the front panel 10.

In a preferred embodiment, the heat exchanger 100 would be a cross-flow heat exchanger. However, many types of heat exchangers are known and can be used with any of the embodiments herein. The heat exchanger 100 may be a cross-flow, parallel flow, or counter-flow heat exchanger. In an exemplary embodiment, the heat exchanger 100 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, external air or circulating gas may enter an exemplary heat exchanger only through plates whose channels or pathways travel parallel to the path of the gas. Because the plates are alternated, the circulating gas and open loop fluid may travel in plates which are adjacent to one another and heat may be transferred between the two gases without mixing the gases themselves (if the heat exchanger is adequately sealed, which is preferable).

In an alternative design for a heat exchanger, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two gases. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to a small sidewall thickness, results in an overall thermal resistance that is low. Thus, an exemplary heat exchanger would be made of plastic and would thus produce a display assembly that is thin and lightweight. Specifically, corrugated plastic may be used for each plate layer where they are stacked together in alternating fashion (i.e. each adjacent plate has channels which travel in a direction perpendicular to the surrounding plates).

In an exemplary embodiment, the electronic display 70 would be a direct LED backlit LCD where the LED backlight would contain a plurality of LEDs mounted on a thermally conductive substrate (preferably a metal core PCB). The rear surface of the LED backlight would preferably contain a thermally conductive plate which may be in conductive thermal communication with the channel 102.

The circulating gas 700 and open loop fluid 400 can be any number of gaseous matters. In some embodiments, air may be used as the gas for all. Preferably, because the circulating gas 700 travels in front of the electronic display 70 it should be substantially clear, so that it will not affect the appearance of the image to a viewer. The circulating gas 700 should also preferably be substantially free of contaminates and/or particulate (ex. dust, dirt, pollen, water vapor, smoke, etc.) in order to prevent an adverse effect on the image quality and/or damage to the internal electronic components. Generally speaking, exemplary embodiments would utilize ambient air as the open loop fluid 400.

The cooling system may run continuously. However, if desired, temperature sensing devices may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

Figure 23:
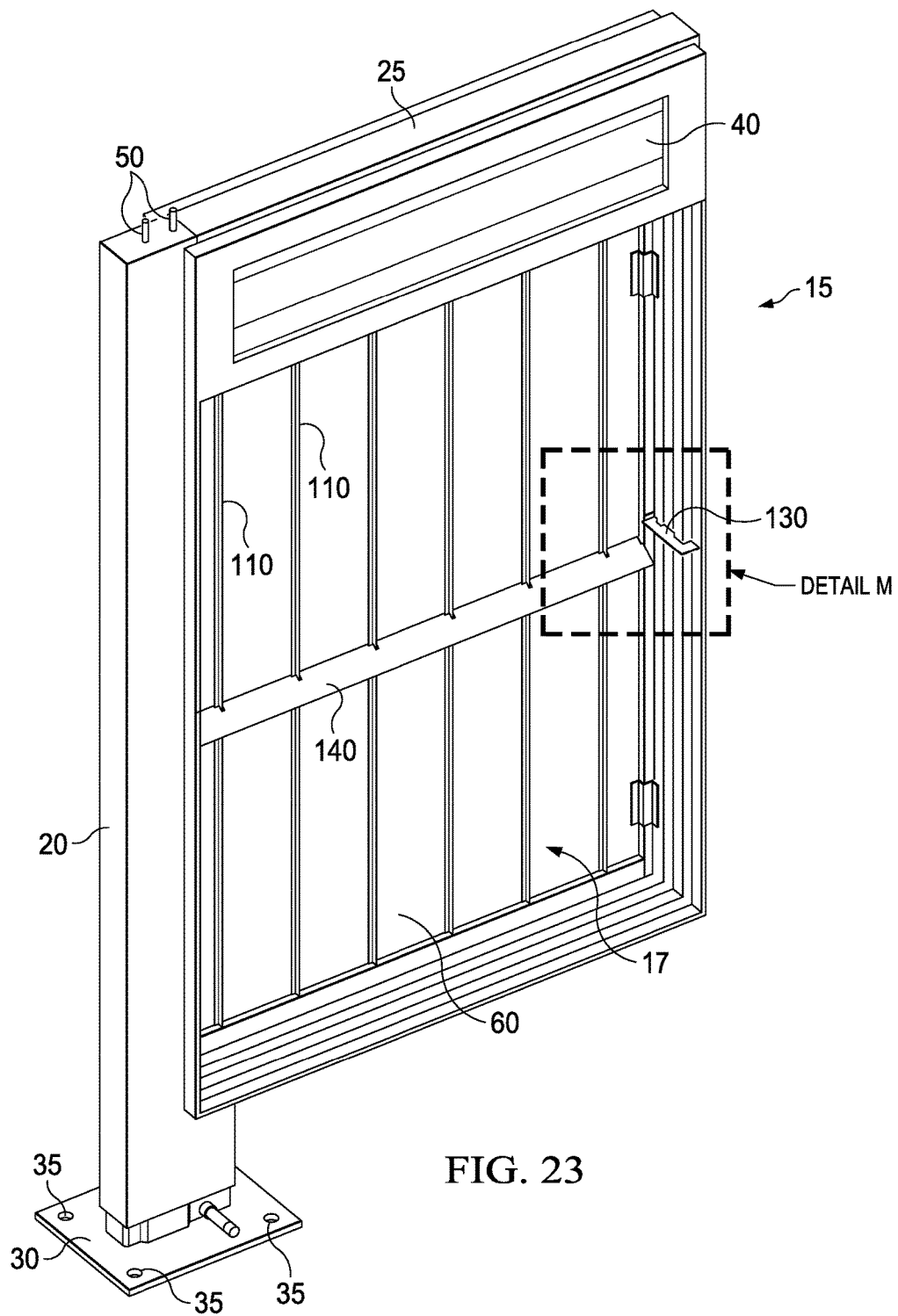
FIG. 23 is a front perspective view of the assembly of FIG. 1 showing only the rear panel, free standing display housing, and a select portion of the display assembly in isolation from all other surrounding components, and indicating detail M.
Figure 24:
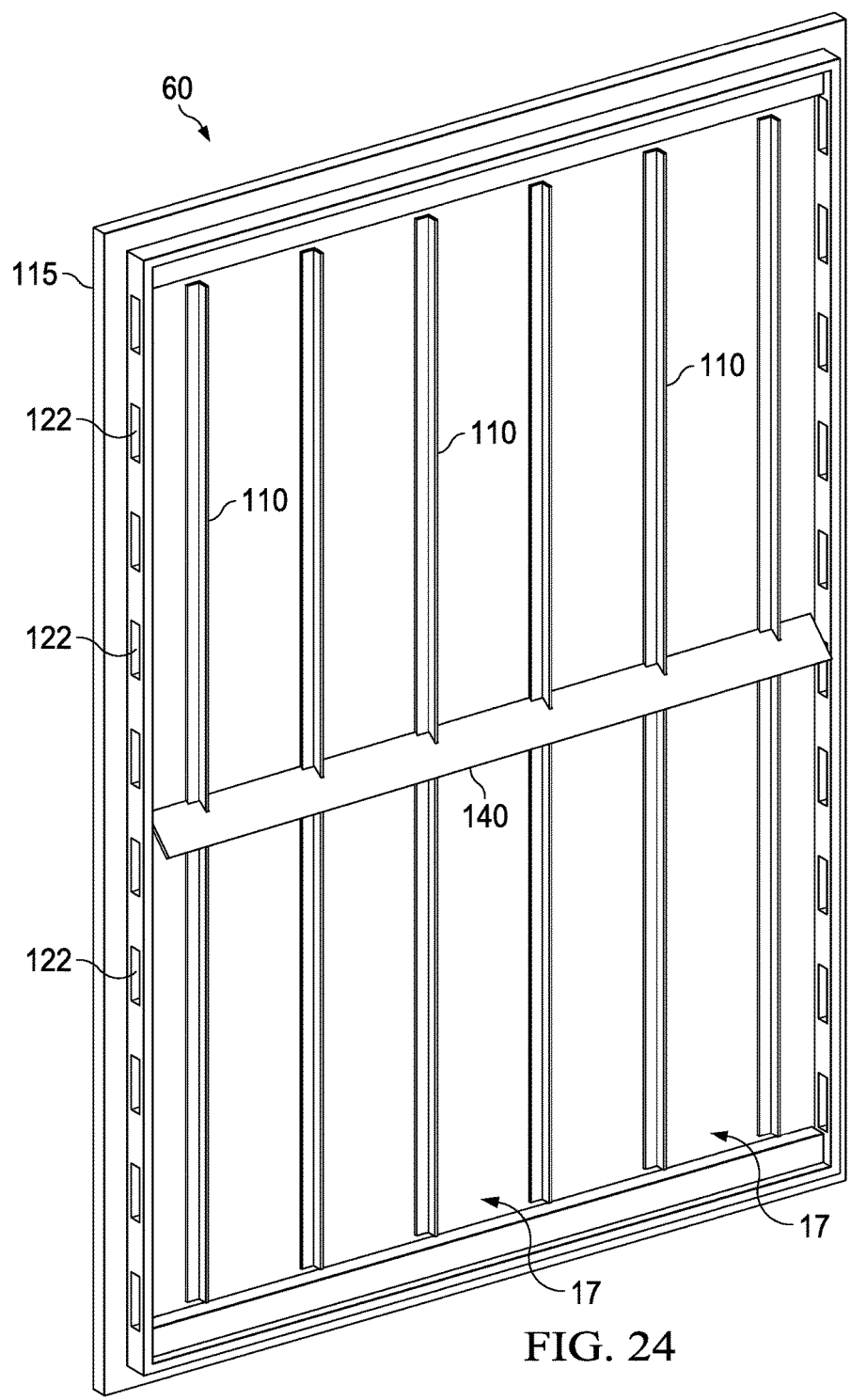
FIG. 24 is a top view of the assembly of FIG. 1, showing only the rear panel and select portions of the display assembly in isolation from all other surrounding components.
Figure 25:
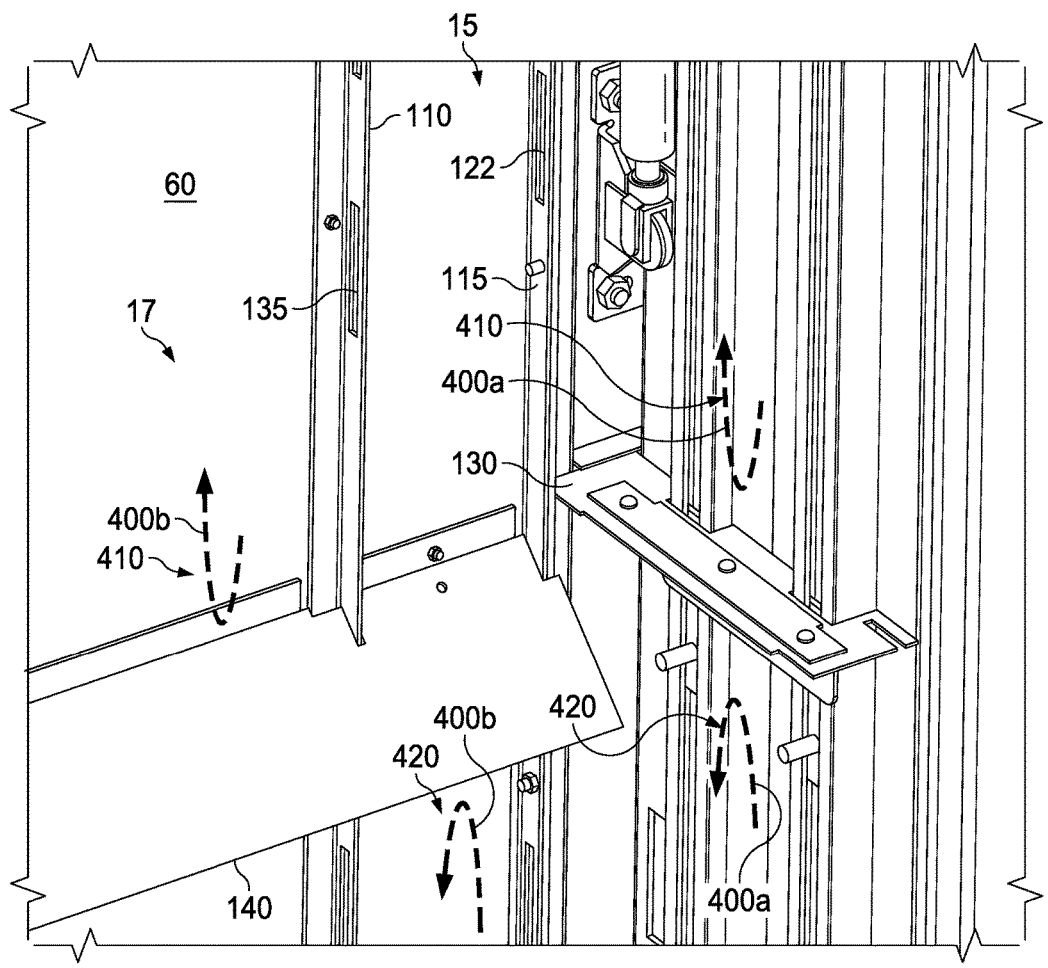
FIG. 25 is a front perspective view of Detail M shown in FIG. 23.

FIGS. 23 through 25 illustrate a central septum 140 which is preferably positioned substantially horizontally and near the vertical centerline of the assembly 5, although embodiments could also place them near the top or bottom of the assembly 5, away from the vertical centerline that extends along substantially the midline of the front surface of the rear panel 60. A right channel septum 130 extends substantially along the midline of the right side interior edge of the free standing display housing 15 such that it is generally aligned with the central septum 140. Similarly, a left channel septum 130 may be affixed on the left side interior edge of the assembly 5 such that it is aligned with the central septum 140.

The central septum 140, the right channel septum 130, and the left channel septum 130 (hereinafter collectively the "horizontal partition") may be configured to substantially divide the door cavity 17 into an upper and lower half. The horizontal partition may be configured such that it creates a substantially air-tight seal between the upper and lower halves of the door cavity 17. Optionally, the horizontal partition may further comprise an expandable material, such as polyurethane foam, utilized in conjunction with the horizontal partition to provide the airtight seal between the upper and lower halves. In exemplary embodiments the central septum 140 may be comprised of a sufficiently flexible material, such as a polymer, to create an airtight seal in the door cavity 17. In alternate embodiments, the central septum 140 may be comprised of a rigid material. In exemplary embodiments, the right channel septum 130 and the left channel septum 130 may be rigid.

In an exemplary embodiment, the open loop fluid 400 may be ingested via the gap 45 (and optional rear gap 44) in the upper half of the assembly 5. Said open loop fluid 400a may travel along the right side channel 19 until a portion of said fluid reaches the right channel septum 130 and is prevented from traveling beyond. Similarly, the open loop fluid 400a may travel along the left side channel 18 until a portion of said fluid reaches the left side channel septum 130. Said portions of the open loop fluid may be forced to return vertically in the opposite direction and circulate through the upper half of right side channel 19 and the left side channel 18, respectively, until eventually being ingested via the intake apertures 65 and 75, as discussed in the previous figures.

In a similar fashion, open loop fluid 400b which travels along the door cavity 17 may travel vertically until a portion of said fluid 400b reaches central septum 140 and is prevented from traveling beyond. In this way, fluid 400b which has been ingested (but has not traveled through the heat exchanger 100 or the channel 102) cannot mix with the fluid 400b which has traveled through the heat exchanger 100 or the channel 102 and needs to be exhausted out of the gap 45 (and optional rear gap 44).

As also discussed in the previous figures, the open loop fluid 400 may circulate through the optional heat exchanger 100 until eventually being exhausted via the exhaust apertures 85. In exemplary embodiments, this path may comprise the second gaseous pathway 420. The open loop fluid 400 may then eventually return to the right side channel 19 or the left side channel 18 and travel vertically therein. The right channel septum 130 and the left channel septum 130, respectively, may prevent said open loop fluid from traveling beyond the midline of assembly 5 and thereby prevent the open loop fluid from each half of the assembly 5 from becoming mixed. That is, open loop fluid not yet ingested via the intake apertures 65 and 75 may not be mixed with open loop fluid already ingested via said intake apertures 65 and 75. The open loop fluid encountering the right side septum 130 and the left side septum 130, respectively, may be forced to return vertically in the opposite direction until eventually being exhausted from the assembly 5 via the gap 45 (and optional rear gap 44).

Figure 26A:
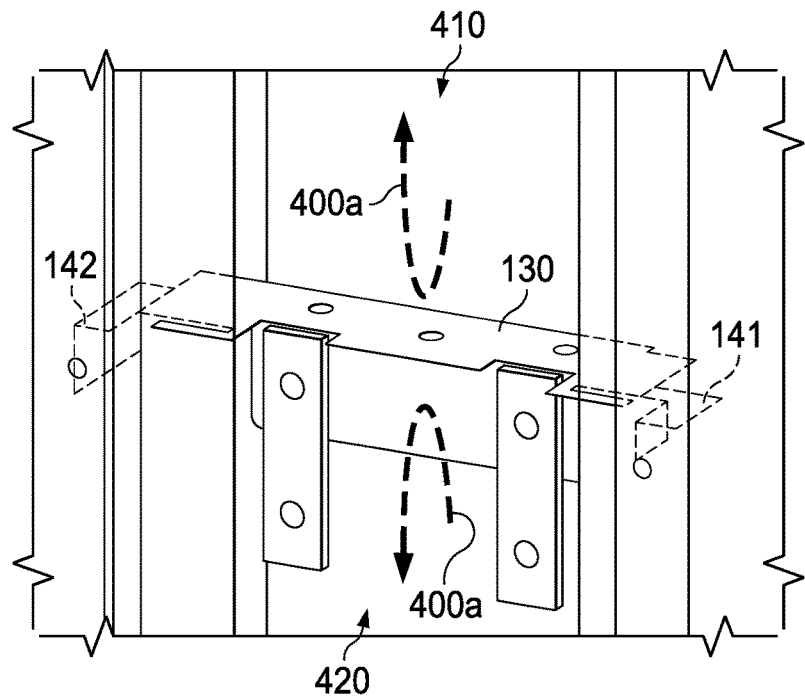
FIG. 26A is a front perspective view of a septum shown with only the free standing display housing and select portions of the display assembly in isolation from all other surrounding components.
Figure 26B:
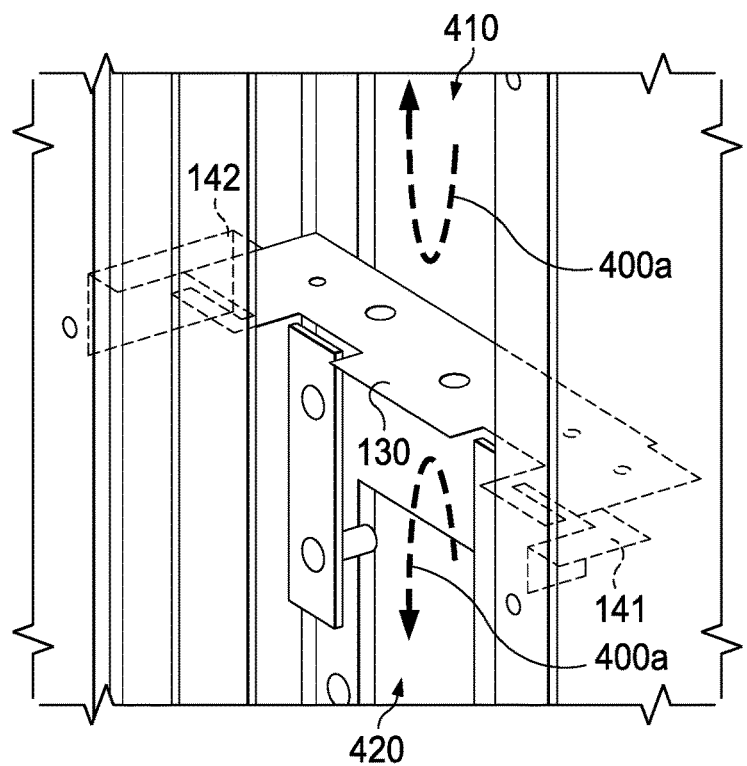
FIG. 26B is another front perspective view of the septum, again shown with only the free standing display housing and select portions of the display assembly in isolation from all other surrounding components.

FIG. 26A and FIG. 26B illustrate exemplary embodiments of the channel septums 130. In such embodiments, a portion of the channel septums 141 may be adjustable such that (if desired) a portion of the open loop fluid 400a may be permitted to pass by the channel septums 130, thereby permitting a limited amount of mixing between the ingestion and exhaustion open loop fluids. In such embodiments, a second portion of the channel septums 142 may be static, such that they may not be adjusted and provide a substantially air-tight seal such that ingestion and exhaustion open loop fluids may not be mixed. In other embodiments, the entirety of the channel septums 130 may be adjustable. In still other embodiments, the entirety of the channel septums 130 may be static.

It is to be understood that the spirit and scope of the disclosed embodiments provides for the cooling of many types of displays. By way of example and not by way of limitation, embodiments may be used in conjunction with any of the following electronic image assemblies: LCD (all types), light emitting diode (LED), organic light emitting diode (OLED), field emitting display (FED), light emitting polymer (LEP), organic electro luminescence (OEL), plasma displays, and any other thin panel electronic image assembly. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition liquid crystal displays (LCD). While the embodiments described herein are well suited for outdoor environments, they may also be appropriate for indoor applications (e.g., factory/industrial environments, spas, locker rooms) where thermal stability of the display may be at risk.

As is well known in the art, electronic displays can be oriented in a portrait manner or landscape manner and either can be used with the embodiments herein.

It should also be noted that the variety of cooling loops that are shown in the figures may be shown in a horizontal or vertical arrangement but it is clearly contemplated that this can be reversed or changed depending on the particular embodiment. Thus, the open loop may run horizontally or vertically and in a clockwise or counter-clockwise direction. Further, the open loop may also be horizontal or vertical and can run left to right, right to left, and top to bottom, or bottom to top.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

I claim:

1. An electronic display assembly comprising:
an electronic display;
a housing and front panel which surround the electronic display;
an ingestion gap for ingesting open loop fluid positioned along a vertical and a horizontal portion of a perimeter of the front panel;
an exhaustion gap for exhausting open loop fluid positioned along a vertical and a horizontal portion of a perimeter of the front panel;
a channel positioned behind the electronic display;
a first gaseous pathway for open loop fluid to travel from the ingestion gap to the channel;
a second gaseous pathway for open loop fluid to travel from the channel to the exhaustion gap;
a fan positioned to cause the flow of the open loop fluid;
a buffer zone positioned between the ingestion gap and the exhaustion gap; and
a central septum placed within the buffer zone.

2. The electronic display assembly of claim 1 wherein:
the ingestion gap permits the ingestion of ambient air into the housing.

3. The electronic display assembly of claim 1 further comprising:
a first side channel positioned vertically and forming at least a portion of the first gaseous pathway; and
a second side channel positioned vertically and forming at least a portion of the second gaseous pathway.

4. The electronic display assembly of claim 3 further comprising:
a channel septum placed within the first side channel.

5. The electronic display assembly of claim 4 wherein:
the channel septum substantially prevents the vertical flow of open loop fluid.

6. The electronic display assembly of claim 1 wherein:
the ingestion gap and the exhaustion gap face an intended observer of the electronic display.

7. An electronic display assembly comprising:
an electronic display;
a housing surrounding the electronic display;
an ingestion gap on the housing positioned to face an intended observer of the electronic display;
an exhaustion gap on the housing positioned to face an intended observer of the electronic display;
a channel positioned behind the electronic display;
a first side channel positioned vertically and permitting gaseous communication between the ingestion gap and the channel;
a second side channel positioned vertically and permitting gaseous communication between the channel and the exhaustion gap;
a fan positioned to cause open loop fluid to flow into the ingestion gap, through the first side channel, through the channel, through the second side channel, and exhausting out of the exhaustion gap;
a buffer zone positioned between the ingestion gap and the exhaustion gap; and
a central septum placed at the same vertical height as the buffer zone.

8. The electronic display assembly of claim 7 further comprising:
a channel septum placed within the first side channel.

9. The electronic display assembly of claim 7 further comprising:
a heat exchanger having a first pathway for open loop fluid and a second pathway for circulating gas; and
a circulating fan positioned to force circulating gas through the heat exchanger.

10. The electronic display assembly of claim 7 wherein:
the channel is defined by the space between an LED backlight and a plate.

11. The electronic display assembly of claim 7 wherein:
the ingestion gap is positioned on a first vertical half of the assembly, while the exhaustion gap is positioned on the opposing vertical half of the assembly.

12. The electronic display assembly of claim 7 further comprising:
a door cavity behind the electronic display which accepts open loop fluid from the first side channel and directs it towards the channel behind the electronic display.

13. An electronic display assembly comprising:
an electronic display;
a housing and front panel which surround the electronic display;
an ingestion gap positioned above the vertical center of the electronic display and located between the front panel and the housing;
an exhaustion gap positioned below the vertical center of the electronic display and located between the front panel and the housing;
a heat exchanger having a first pathway for open loop fluid and a separate second pathway for circulating gas;
a circulating fan positioned to force circulating gas through the heat exchanger;
a central septum placed between the ingestion gap and the exhaustion gap and near the vertical center of the electronic display;
a fan positioned to cause the flow of open loop fluid into the ingestion gap, through the heat exchanger, and out of the exhaustion gap;
a first side channel positioned vertically and permitting gaseous communication between the ingestion gap and the heat exchanger;
a second side channel positioned vertically and permitting gaseous communication between the heat exchanger and the exhaustion gap;

a first side channel septum placed within the first side channel; and
a second side channel septum placed within the second side channel.

14. The electronic display assembly of claim 13 wherein:
the first and second side channel septums substantially block the vertical flow of open loop fluid.

* * * * *

UNITED STATES PATENT AND TRADEMARK OFFICE
CERTIFICATE OF CORRECTION

PATENT NO. : 9,723,765 B2  
APPLICATION NO. : 14/624268  
DATED : August 1, 2017  
INVENTOR(S) : Ryan DeMars It is certified that error appears in the above-identified patent and that said Letters Patent is hereby corrected as shown below:

In the Specification

Column 6, Line 16, delete "gap 44 and optional rear gap 45" and insert -- gap 45 and optional rear gap 44 --.

Column 6, Line 34, delete "FIG. 5 and FIG. 6" and insert -- FIG. 7 and FIG. 8 --.

Column 6, Lines 39-40, delete "gap 44 and optional rear gap 45" and insert -- gap 45 and optional rear gap 44 --.

Column 6, Line 64, delete "gap 44 (and optional rear gap 45)" and insert -- gap 45 (and optional rear gap 44) --.

Signed and Sealed this  
Tenth Day of July, 2018

Andrei Iancu  
*Director of the United States Patent and Trademark Office*